(12) United States Patent
Papadopoulou et al.

(10) Patent No.: US 6,178,539 B1
(45) Date of Patent: Jan. 23, 2001

(54) METHOD AND SYSTEM FOR DETERMINING CRITICAL AREA FOR CIRCUIT LAYOUTS USING VORONOI DIAGRAMS

(75) Inventors: Evanthia Papadopoulou, White Plains, NY (US); Der-Tsai Lee, Wilmette, IL (US)

(73) Assignee: International Business Machines Corporation, Armonk, NY (US)

( * ) Notice: Under 35 U.S.C. 154(b), the term of this patent shall be extended for 0 days.

(21) Appl. No.: 09/156,069

(22) Filed: Sep. 17, 1998

(51) Int. Cl.$^7$ ..................................................... G06F 17/50
(52) U.S. Cl. .......................... 716/7; 716/4; 716/2; 716/11
(58) Field of Search ............................................... 716/7, 4

(56) References Cited

U.S. PATENT DOCUMENTS

| | | | | |
|---|---|---|---|---|
| 5,773,315 | * | 6/1998 | Jarvis ...................................... | 438/14 |
| 5,777,901 | * | 7/1998 | Berezin et al. ....................... | 364/578 |
| 6,044,208 | * | 3/2000 | Papadopoulou et al. ........ | 395/500.05 |
| 6,066,179 | * | 5/2000 | Allan ........................................ | 716/4 |

OTHER PUBLICATIONS

Papadopoulou et al., Critical Area Computation—A New Approach, Proceedings of the 1998 International Symposium on Physical Design, pp. 89–94, Apr. 1998.*

P.-Y. Hsiao et al., A Sweeping Line Algorithm Based on Two–demensional Region Search, 1990 IEEE Region 10 Conference on Computer and Communication Systems, pp. 496–500, Sep. 1990.*

C.H. Stapper et al., Yield Model for ASIC and Processor Chips, International Workshop on Defect and Fault Tolerance in VLSI Systems, pp. 136–143, Oct. 1993.*

E. Papadopoulou, Critical Area Computation for Missing Material Defects in VLSI Circuits, pp. 140–146, Apr. 2000.*

H. Xue et al., Fast Multi–layer Critical Area Computation, International Workshop on Defect and Fault Tolerance in VLSI Systems, pp. 117–124, Oct. 1993.*

E. Papadopoulou et al., Critical Area Computation Via Voronoi Diagrams, IEEE Transactions on Computer–Aided Design of Integrated Circuits and Systems, pp. 463–474, Apr. 1999.*

C.H. Stapper et al., Integrated Circuit Yield Manageent and Yield Analysis: Development and Implementation, IEEE Transactions on Semiconductor Manufacturing, pp. 95–102, May 1995.*

A.R. Dalai et al., A Layout–Driven Yield Predictor and Fault Generator for VLSI, IEEE Transactions on Semiconductor Manufacturing, pp. 77–82, Feb. 1993.*

Aurenhammer et al., "Voronoi Diagrams,", Chapter 18, Textbook on Computational Geometry, J. Sack and G. Urrutia (eds), to appear, pp. 3–101; Feb. 1996.

Dehne et al., "The Big Sweep: On the Power of the Wavefront Approach to Voronoi Diagrams," Algorithmica (1977), 17, 19–32.

(List continued on next page.)

*Primary Examiner*—Paul R. Lintz
*Assistant Examiner*—Annette M. Thompson
(74) *Attorney, Agent, or Firm*—F. Chau & Associates,LLP

(57) ABSTRACT

A method for computing critical area for shorts of a layout, in accordance with the present invention, includes the steps of computing a Voronoi diagram for the layout, computing a second order Voronoi diagram to arrive at a partitioning of the layout into regions, computing critical area within each region and summing the critical areas to arrive at a total critical area for shorts in the layout. A system is also provided for calculating the critical area.

36 Claims, 11 Drawing Sheets

OTHER PUBLICATIONS

A. V. Ferris–Prabhu, "Modeling the Critical Area in Yield Forecasts", IEEE J. of Solid State Circuits, vol. SC–20, No. 4, Aug. 1985, 874–878.

A. V. Ferris–Prabhu, "Defect Size Variations and Their Effect on the Critical Area of VLSI Devices," IEEE J. of Solid State Circuits, vol. SC–20, No. 4, Aug. 1985, 878–880.

Gandemer et al., "Critical Area and Critical Levels Calculation in I. C. Yield Modeling," IEEE J. of Solid State Circuits, vol. 35, No. 2, Feb. 1988, 158–166.

D. T. Lee, "On k–Nearest Neighbor Voronoi Diagrams in the Plane," IEEE Transactions On Computers, vol. C–31, No. 6, Jun. 1982, pp. 478–487.

W. Maly, "Modeling of Lithography Related Yield Losses for CAD of VLSI Circuits," IEEE Transactions on Computer–Aided Design, vol. CAD–4, No. 3, 166–177, Jul. 1985.

Maly et al., "Yield Estimation Model for VLSI Artwork Evaluation," Electron Lett., vol. 19, No. 6, 226–227, Mar. 1983.

Papadopoulou et al, "L $\infty$ Voronoi Diagrams and Applications to VLSI Layout and Manufacturing," Manuscript, Extended Abstract submitted to International Symposium on Algorithms and Computation, 1998. (To appear in proceedings of ISAAC98, Dec. 1998).

Pineda et al., "IC Defect Sensitivity for Footprint–Type Spot Defects," IEEE Trans. on Computer–Aided Design, vol. 11, No. 5, 638–658, May 1992.

Wagner et al., "An Interactive VLSI CAD Tool for Yield Estimation," IEEE Trans. On Semiconductor Manufacturing, vol. 8, No. 2, 1995, 130–138.

Walker et al., "VLASIC: A Catastrophic Fault Yield Simulator for Integrated Circuits," IEEE Trans. on Computer–Aided Design, vol. CAD–5, No. 4, 541–556, Oct. 1986.

D.M. H. Walker, "Critical Area Analysis," Journal Preprint, Carnegie Mellon University, SRC Pub. C91611, Aug. 1991.

* cited by examiner

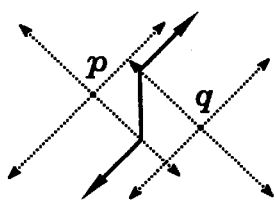
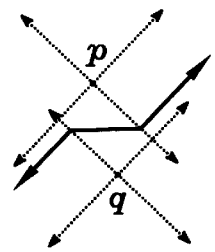
FIG. 1A    FIG. 1B
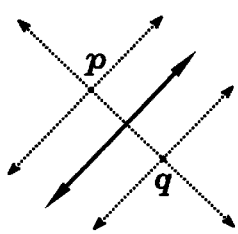
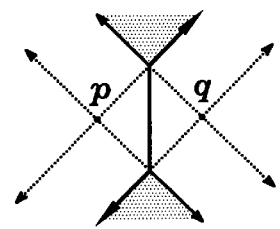
FIG. 1C    FIG. 1D
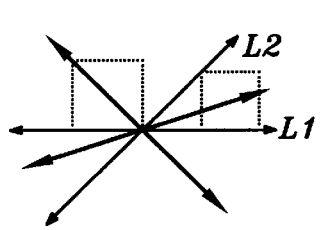
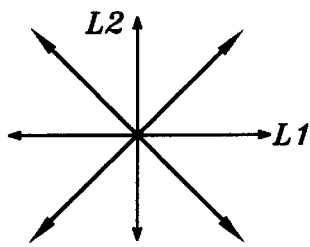
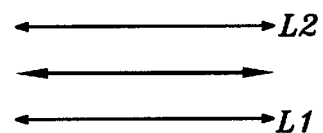
FIG. 2A    FIG. 2B    FIG. 2C

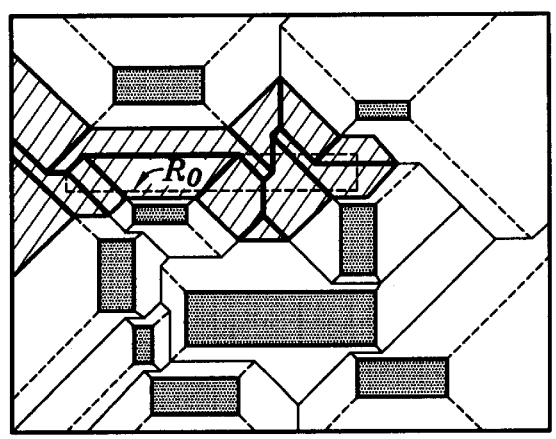
FIG. 14
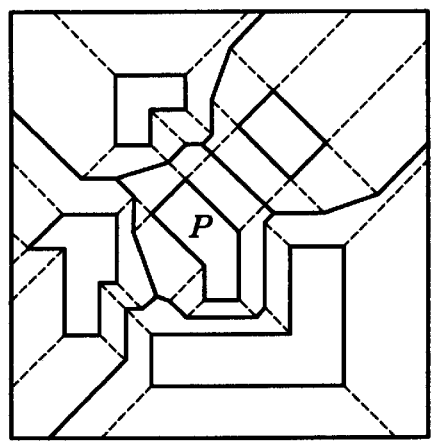 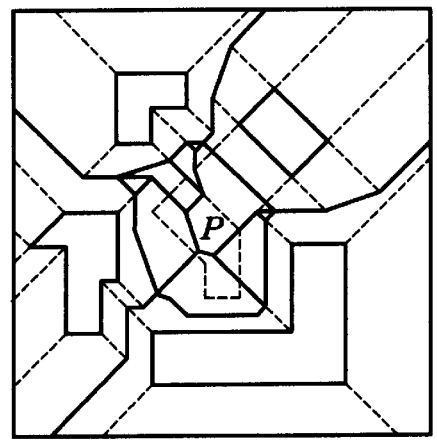
FIG. 15A        FIG. 15B

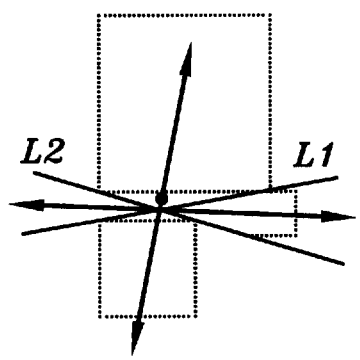
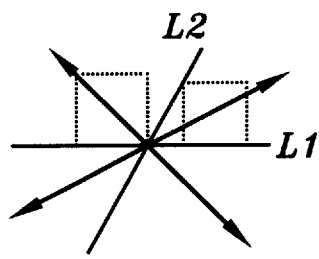
FIG. 18A  FIG. 18B
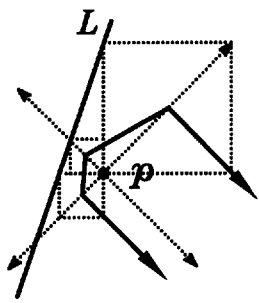
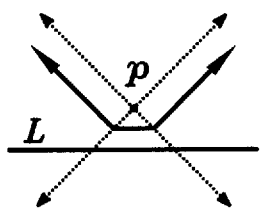
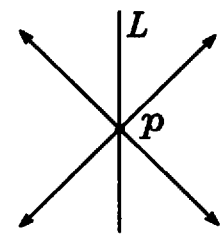
FIG. 19A  FIG. 19B  FIG. 19C
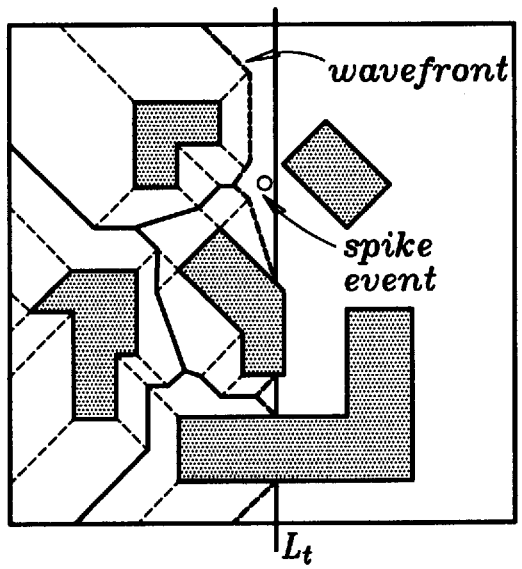
FIG. 20

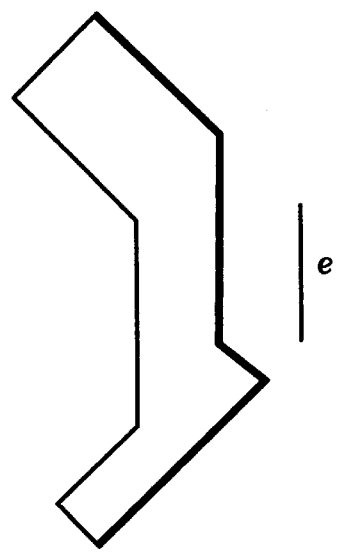
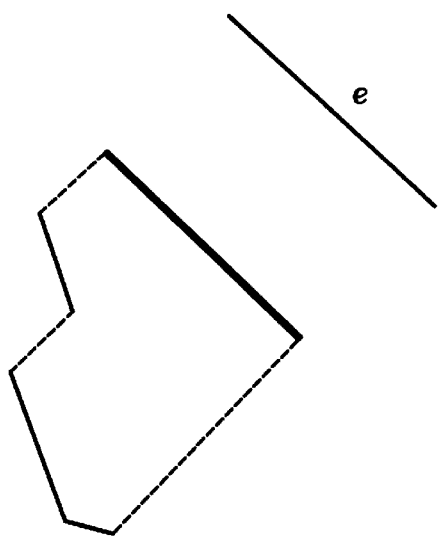
FIG. 23A　　　　　　FIG. 23B
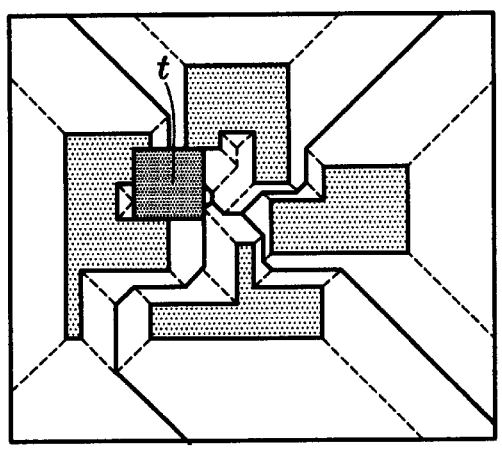
FIG. 24

METHOD AND SYSTEM FOR DETERMINING CRITICAL AREA FOR CIRCUIT LAYOUTS USING VORONOI DIAGRAMS

GOVERNMENTAL INFORMATION

The U.S. Government has a paid-up license in this invention and the right in limited circumstances to require the patent owner to license others on reasonable terms of grant numbers N00014-95-1-1007 and N00014-97-1-0514 awarded by United States Office of Naval Research.

BACKGROUND OF THE INVENTION

1. Field of the Invention

The present invention relates to determination of critical area and, more particularly, to a method and system for computing critical areas for predicting yield for semiconductor devices.

2. Description of the Related Art

Critical area of a very large scale integration (VLSI) layout is a measure that reflects the sensitivity of the layout to defects occurring during the manufacturing process. Critical area is widely used to predict the yield of a VLSI chip. Yield prediction is essential in today's VLSI manufacturing due to the growing need to control cost. Models for yield estimation are based on the concept of critical area which represents the main computational problem in the analysis of yield loss due to spot defects during fabrication. Spot defects are caused by particles such as dust and other contaminants in materials and equipment and are classified into two types: "extra material" defects causing shorts between different conducting regions and "missing material" defects causing open circuits.

Extra material defects appear most frequently in a typical manufacturing process and are the main reason for yield loss. The yield of a chip, denoted by Y, is computed as $$Y = \prod_{i=1}^{m} Y_i$$

where Yi is the yield associated with the ith step of the manufacturing process. The yield of a single processing step is modeled as $$Y_i = \left(1 + \frac{dA_c}{\alpha}\right)^{-\alpha}$$

where d denotes the average number of defects per unit of area, a the clustering parameter, and $A_c$, the critical area.

For a circuit layout C, the critical area is defined as $$A_c = \int_0^\infty A(r) D(r) dr$$

where A(r) denotes the area in which the center of a defect of radius r must fall in order to cause circuit failure and D(r) is the density function of the defect size. The defect density function has been estimated as follows:

$$D(r) = \begin{cases} \frac{cr^q}{r_0^{q+1}}, & 0 \leq r \leq r_0 \\ \frac{cr_0^{p-1}}{r^p}, & r_0 \leq r \leq \infty \end{cases} \quad \text{(EQ. 1)}$$

where p, q are real numbers (typically p 3, q=1), c=(q+1)(p−1)(q+p), and $r_0$ is some minimum optically resolvable size.

Existing methods for yield prediction and critical area computation can be classified into the following types:

1. Geometric methods: Compute A(r) for several different values of r independently. Use the results to approximate $A_c$. The methods to compute A(r) are usually based on shape-expansion followed by shape-intersection (see e.g., S. Gandemer et al., "Critical Area and critical levels calculation in IC yield modeling", *IEEE J. of Solid State* Circuits, vol.35, No 2, February 1988, 158–166.) and have a quadratic flavor. For rectilinear layouts there is also a scan-line method which computes critical areas in multiple layers. (see e.g. J. Pineda de Gyvez, C. Di, "IC Defect Sensitivity for Footprint-Type Spot Defects", IEEE Trans. on Computer-Aided Design, vol. 11, no 5, 638–658, May 1992)

2. Virtual artwork approach: Build a virtual artwork having the same statistical features as the nominal IC layout. The virtual artwork is arranged in a form allowing easy calculation of the critical area as a function of the defect radius (see e.g., W. Maly, "Modeling of lithography related yield losses for CAD of VLSI circuits" IEEE Transactions on Computer-Aided Design, vol. CAD-4, no 3, 166–177, July 1985.). Accuracy is limited by differences in the detail of the nominal and virtual artworks.

3. Monte Carlo approach: Draw a large number of defects with their radii distributed according to D(r), check for each defect if it causes a fault, and divide the number of defects causing faults over the total number of defects. (See e.g., H. Walker and S. W. Director, "VLASIC: A yield simulator for integrated circuits", IEEE Trans. on Computer-Aided Design, vol. CAD-5, no 4, 541–556, October 1986.)

4. Grid approach: Assume an integer grid over the layout. Compute the critical radius (the radius of the smallest defect causing a fault at this point) for every grid point (see e.g., I. A. Wagner and 1. Koren, "An Interactive VLSI CAD Tool for Yield Estimation", IEEE Trans. on Semiconductor Manufacturing Vol. 8, No.2, 1995, 130–138). The method works in $O(I^{1.5})$ time, where I is the number of grid points. The accuracy depends on the density of the grid.

The above approaches suffer from accuracy and complexity problems as described. Therefore, a need exists for an improved approach for computing the critical area for shorts in a single layer of a semiconductor device. A further need exists for a low polynomial algorithm for computing critical area for shorts with improved accurately and reduced complexity.

SUMMARY OF THE INVENTION

A method for computing critical area for shorts of a layout, in accordance with the present invention, includes the steps of computing a Voronoi diagram for the layout, computing a second order Voronoi diagram to arrive at a partitioning of the layout into regions, computing critical area within each region and summing the critical areas to arrive at a total critical area for shorts in the layout.

A method for predicting yield based on critical area for shorts of a layout of a circuit, includes the steps of computing a Voronoi diagram for the layout, computing a second order Voronoi diagram to arrive at a partitioning of the layout into regions, computing critical area within each region, summing the critical areas to arrive at a total critical area for short in the layout and predicting a sensitivity to defects of the layout based on the total critical area.

In particularly useful methods, the step of decomposing each region into shapes for calculating the critical areas is preferably included. The step of computing critical area may include the step of computing the critical area according to the following equation:

$$A_c = \int_0^\infty A(r)D(r)dr,$$

where $A_c$ is the critical area, $A(r)$ is the area of the critical region for defects of radius r and $D(r)$ is a defect density function. The defect density function may include the defect size distribution $D(r)=r_0^2/r^3$ where r denotes spot defect radius and $r_0$ denotes a constant size. The areas for the regions may be classified such that some areas contribute to the critical area and other subtract from the critical area.

The Voronoi diagram and the second order Voronoi diagram preferably include an $L_\infty$ distance metric. The step of computing the Voronoi diagram and the step of computing the second order Voronoi diagram preferably include the step of computing them using a plane sweep or sweep line algorithm. The method may further include the step of computing areas for regions of the layout associated with shapes having edges with a slope of ±1 or horizontal and vertical edges. The method may further include the step of adapting computations of areas for the regions of the layout associated with shapes having edges with any slope. The step of summing the critical areas may include the steps of adding areas that contribute to the total critical areas, subtracting areas that reduce the total critical area and ignoring other areas.

A computer based system for computing critical area for shorts of a layout, includes means for computing a Voronoi diagram for the layout and a second order Voronoi diagram using a sweep line algorithm to arrive at a partitioning of the layout into regions. Also, included are means for computing critical area within each region and means for summing the critical areas to arrive at a total critical area for shorts in the layout.

In alternate embodiments of the system, means for decomposing each region into shapes for calculating the critical areas may be included. The shapes may include at least one of triangles, rectangles and trapezoids. The means for computing critical area may include means for computing the critical area according to the following equation:

$$A_c = \int_0^\infty A(r)D(r)dr,$$

where $A_c$ is the critical area, $A(r)$ is the area of the critical region for defects of radius r and $D(r)$ is a defect density function. The defect density function may include the defect size distribution $D(r)=r_0^2/r^3$ where r denotes spot defect radius and $r_0$ denotes a constant size. The areas for the regions may be classified such that some areas contribute to the critical area and others subtract from the critical area. The Voronoi diagram and the second order Voronoi diagram may include an $L_\infty$ distance metric. Means for adapting computations of areas for the regions of the layout associated with shapes having edges with any slope may also be included. The layout may further include nets, circuits and/or circuit components, etc.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIG. 1 illustrates an $L_\infty$ bisector between two points;

FIG. 2 illustrates an $L_\infty$ bisector between two lines;

FIG. 14 is a second order Voronoi diagram in a Voronoi cell of $R_0$ in accordance with the present invention;

FIG. 15a is a Voronoi diagram for layouts with ortho-45 shapes in accordance with the present invention;

FIG. 15b is a second order Voronoi diagram subdivision within the Voronoi cell shown in FIG. 15a;

FIGS. 18a–b illustrate $L_\infty$ bisectors between two lines in accordance with the present invention;

FIGS. 19a–c illustrate $L_\infty$ bisectors between a point and a line in accordance with the present invention;

FIG. 20 is a Voronoi diagram during a sweeping process in accordance with the present invention;

FIGS. 23 a–b illustrates classification of Voronoi edges in accordance with the present invention; and FIG. 24 is a layout showing a critical radius for a square defect in accordance with the present invention.

DETAILED DESCRIPTION OF PREFERRED EMBODIMENTS

Figure 3A:
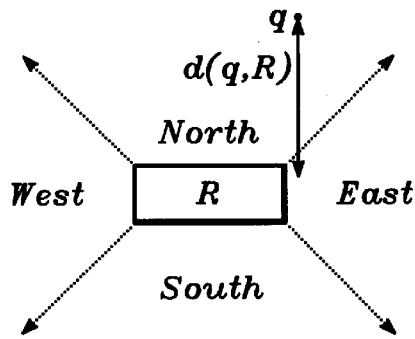
FIG. 3 illustrates 45° rays emanating from a point p and corners of rectangle R for partitioning a plane into four quadrants in accordance with the present invention.

The invention includes a novel approach for computing the critical area for shorts in a circuit layout. The critical area calculation is the main computational problem in VLSI yield prediction. The method is based on the concept of Voronoi diagrams and computes the critical area for shorts (for all possible defects) accurately in O(n log n) time, where n is the size of the input. The method is presented for rectilinear layouts but it is extendible to general layouts. The present disclosure further describes a method for speeding up the grid method of Wagner and Koren, in the above referenced article. The method is based on a low polynomial algorithm to compute critical area for shorts accurately in irregular rectilinear layouts.

Defects are typically modeled as circles for critical area computations. The underlying reason for modeling defects as circles is the common use of Euclidean geometry. In the present invention, a spot defect of size r is modeled as a square of side 2r (i.e., a square of radius r). In reality, spot defects have any kind of shape thus, modeling defects as squares is as good as the circle model. Moreover, in many prior art methods, although defects are modeled as circles the critical area is approximated in a way that would not make much difference if the defects were squares or circles.

Modeling defects as squares instead of circles corresponds to computing critical area in an $L_\infty$. metric instead of the Euclidean. The Euclidean ($L_2$) distance between two points is the length of the line segment joining the two points. In $L_\infty$, the distance between two points $p=(x_p, y_p)$ and $q=(x_q, y_q)$ is the maximum of the horizontal and the vertical distance between p and q i.e., $d(p,q)=\max\{|x_p-x_q|,|y_o-y_q|\}$. Intuitively, the $L_\infty$ distance is the size of the smallest square touching p and q. Note that the Euclidean distance corresponds to the size of the smallest circle touching p and q. Note also that in the $L_\infty$ metric, the "unit circle" i.e., the locus of points at distance 1 from a center point, is a square of side two (i.e., a square of radius 1) (See also, FIG. 24). In contrast, the unit circle in Euclidean geometry is an ordinary circle of radius 1. The $L_\infty$ distance between a point p and a line l is $d(p,l)=\min\{d(p,q), \forall q \in l\}$.

In the following disclosure, unless otherwise noted, the $L_\infty$ distance is used.

A Voronoi diagram of a set C of polygons is a partition of a plane into regions, called Voronoi cells, each of which is associated with a polygon, called the owner, of the cell. The Voronoi cell of a polygon P, denoted as reg(P), is the locus of points closer to P than to any other polygon (see for example FIG. 5). The Voronoi cell of P is further partitioned into finer cells each of which is associated with an element (edge or vertex) of P. The Voronoi cell of an element $e \in P$ is the locus of points closer to e than to any other element in C. Clearly, the Voronoi cell of an element $e \in P$ is totally contained in the Voronoi cell of P. A boundary that borders two Voronoi cells is called a Voronoi edge, and includes portions of bisectors between the owners of the cells. The point where three or more Voronoi edges meet is called a Voronoi vertex. For more information on Voronoi diagrams in general F. Aurenhammer and R. Klein, "Voronoi Diagrams" chapter 18, *Textbook* on Computational Geometry, J. Sack and G. Urrutia (eds), incorporated herein by reference.

For the Euclidean metric, the boundary of a Voronoi cell may contain parabolic curves. In $L_\infty$, the bisector of two elements (lines or points) is the locus of points at equal $L_\infty$ distance from the two elements. It can be regarded as the locus of points corresponding to centers of squares touching the two elements. FIGS. 1 and 2, illustrate the $L_\infty$ bisector of two points, p and q, and two lines, L1 and L2, respectively. For simplicity, the illustrative example described herein will focus on the rectilinear case and thus shall usually consider vertical and horizontal edges.

Figure 3B:
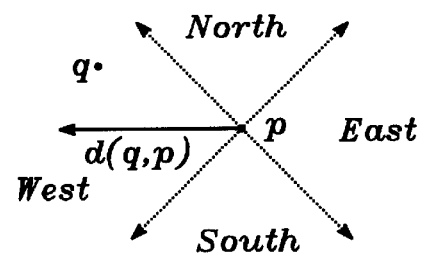

Referring to FIG. 3, an illustrative Voronoi diagram is shown. A rectangle R and the four 45° rays emanating away from the vertices of R. A 45° is a ray of slope −1 or +1. The rays partition the plane into four quadrants referred to as north, south, east and west. For any point q in the north or south quadrant the $L_\infty$ distance to R simplifies to the vertical distance between q and the horizontal line through the respective horizontal edges of R. Similarly for any point q in the east or west quadrant the $L_\infty$ distance to R simplifies to the horizontal distance from q to the vertical line through the respective vertical edges of R. The $L_\infty$ distance between point q and a horizontal (vertical) line is the vertical (horizontal) distance between q and its orthogonal projection to the line. The four 45° rays through the corners of R are bisectors between the edges of R.

Figure 4:
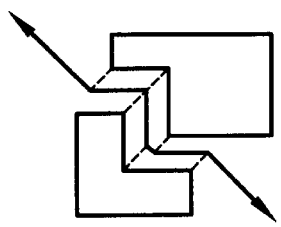
FIG. 4 illustrates an $L_\infty$ bisector between two rectilinear polygons.

Referring to FIG. 4, Consider now two rectilinear polygons P and Q. Their bisector B (i.e., the locus of points at equal $L_\infty$ distance between P and Q) is illustrated in FIG. 4. B includes portions of bisectors between edges of the two polygons. The border of each portion is induced by the 45° rays emanating from the corners of P and Q (i.e., the bisectors of edges in P (Q) which are illustrated by dashed lines in FIG. 4.). Note that the bisector B between P and Q includes only of vertical, horizontal and 45° line segments. (A 45° line segment belongs to a line of slope ±1).

The $L_\infty$ Voronoi diagram of a set of polygons is a skeleton of straight line segments of linear combinatorial complexity. Furthermore, in the special case of rectilinear polygons, the $L_\infty$ Voronoi diagram is a particularly simple skeleton. The $L_\infty$ Voronoi diagram includes line segments in only four orientations, vertical, horizontal, and lines of slope (+1) and (−1).

Figure 5:
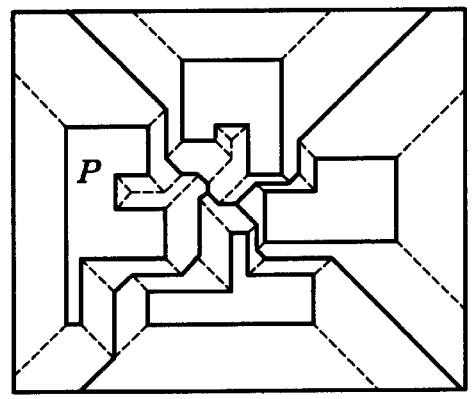
FIG. 5 is an $L_\infty$ Voronoi diagram of four polygons of a layout in accordance with the present invention.
Figure 9:
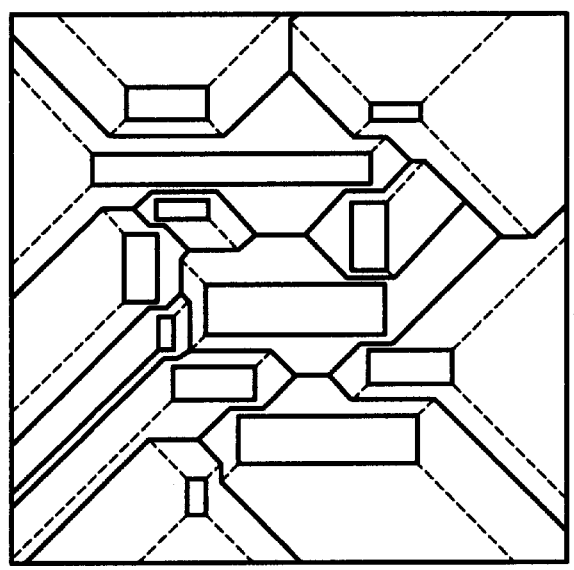
FIG. 9 is an $L_\infty$ Voronoi diagram for rectangles of a layout in accordance with the present invention.

FIGS. 9 and 5 illustrate the Voronoi diagram of a set of rectangles and a set of rectilinear polygons, respectively. Solid edges, in FIGS. 5 and 9, illustrate the Voronoi edges separating the cells of different polygons and dashed edges illustrate Voronoi edges induced by the edges of the same polygon. As it is shown, in a manuscript by E. Papdopoulou and D. T. Lee, "$L_\infty$, Voronoi Diagrams and Applications to VLSI Layout and Manufacturing", incorporated herein by reference, an upper bound on the size of the $L_\infty$ Voronoi diagram of a set of rectilinear polygons C is (2n−2) where n is the number of vertices in C. Note that a Voronoi vertex is the meeting point of at least three Voronoi edges (bisectors) and thus it is equidistant from at least three elements of C.

Given a query point t, let P be the polygon such that t belongs in the Voronoi cell of P; in particular let e be the element of P in whose cell t belongs. Then, t is closer to P than to any other polygon, moreover, t is closer to e than to any other element of C (in the $L_\infty$ sense). Polygon P, and in particular, element e is the nearest neighbor of t. The $L_\infty$ Voronoi diagram encodes nearest neighbor information (in $L_\infty$) for every point in the plane.

Algorithms are available for computing the Euclidean Voronoi diagram of line segments in time O(n log n) in expected or worst case (see. e.g. F. Aurenhammer and R. Klein, "Voronoi Diagrams" chapter 18, *Textbook* on Computational Geometry, J. Sack and G. Urrutia (eds)).

Most of these algorithms may be modified to compute the simpler $L_\infty$ diagram. However, not all are simple to implement. Computing the Euclidean Voronoi diagram of segments is difficult in practice due to the existence of parabolic curves.

As mentioned above, the Voronoi diagram of a set of polygons C basically provides nearest neighbor information for every point in the plane. However, this information is not enough to determine what defect size would cause a short if a defect was centered at a given point. Suppose the set of polygons C represents a layer of a VLSI layout. The critical radius of a point t is the radius of the smallest defect centered at t which overlaps with at least two different polygons (shapes) in different nets. This is shown in FIG. 24. The dark area shown in FIG. 24 shows a critical radius from point t for a square defect. The critical radius of t reflects the size of the smallest defect that would cause a short at point t. To determine the critical radius of a point t whose nearest polygon is P, the second nearest polygon to t is found, say Q (assuming that P and Q belong to different nets). In particular, the element w∈C−P that is nearest to t among all elements in C−P. Then the critical radius of point t is d(w,t)=d(Q,t).

Figure 6:
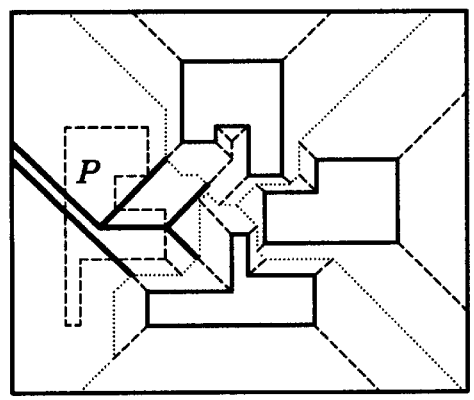
FIG. 6 illustrates a second order $L_\infty$ Voronoi diagram cell P of FIG. 5 in accordance with the present invention.

Referring to FIG. 6, the Voronoi cell of a polygon P is reg(P). For the interior of reg(P), the Voronoi diagram of all polygons except P are included. Then for every point t∈reg(P), the second nearest polygon is known. This determines a critical radius of t. Let $\text{Vor}_p$(C−P) denote the Voronoi diagram of {C−P} restricted in the interior of reg(P). FIG. 6 shows $\text{Vor}_p$ (C−P) within reg(P) in thick lines.

The plane may be partitioned by the above transformation. In particular, for every polygon P∈C partition the interior of reg(P) by the Voronoi diagram of C−P. The subdivision derived in this manner is called the 2nd order Voronoi diagram of C and provides 2nd nearest neighbor information. The 2nd order Voronoi region of an element s∈C−P (s is always an edge in the rectilinear case) within the Voronoi cell of P is defined as $\text{reg}_p(s)=\{x|d(s,x) \leq d(t,x), \forall t \in C-P\}$. Region $\text{reg}_p(s)$ is owned by the unique pair (P,s). The critical radius of every point $x \in \text{reg}_p(s)$ is determined by the distance between x and element s. A square centered at x overlapping with s must also overlap with P (since P is closer to x than s) and thus it causes a short. In other words, s is the element responsible for shorts within $\text{reg}_p(s)$ and induces the critical radius for every point $x \in \text{reg}_p(s)$. Because s is the element providing critical radius information within $\text{reg}_p(s)$, when there is no confusion, P is dropped and s is the owner of $\text{reg}_p(s)$. It is not hard to see that the size of the 2nd order Voronoi diagram cannot be more than twice the size of ordinary Voronoi diagram i.e., it is linear in the size of the input.

The above described 2nd order Voronoi diagram of polygons is based on the concept of kth order Voronoi diagram of line segments which is defined as a planar subdivision where each region is closest to k line segments. A kth order Voronoi diagram may be visualized as a finer subdivision of the cells in the (k−1) order diagram, where the first order diagram is the ordinary Voronoi diagram.

Once the Voronoi diagram of C is available, the 2nd order diagram is not difficult to compute. For the 2nd order diagram within the Voronoi cell of each polygon P only the Voronoi neighbors of reg(P) need to be considered. As shown in FIG. 6, the Voronoi edges in $\text{Vor}_p$(C−P) are obtained by extending the Voronoi edges incident to Voronoi vertices on the boundary of reg(P). More details on how to compute the 2nd order diagram in the rectilinear case are given hereinbelow. In the following, it is assumed that the 2nd order Voronoi diagram is available.

In the computation of critical area for shorts, a pair of distinct polygons may be part of the same net via, i.e. a connection through a different layer. In this case, a defect overlapping with these polygons does not cause a short and thus should not be contributing to critical area. In the above approach it is easy to accommodate this point. Let P, Q be two disjoint polygons that belong to the same net. Considering the Voronoi diagram of C, if the Voronoi cells of P and Q are not neighboring then any defect overlapping P and Q must also overlap with some other polygon. If on the other hand, the regions are neighboring reg(P) and reg(Q) may be united into reg(P∪Q) by removing the adjacent Voronoi edges and treating the resulting region as any other when computing the 2nd order diagram.

A layer in a circuit layout includes a collection of rectilinear (or other polygons)polygons C representing circuits components. Overlapping polygons are unified into single shapes and thus all polygons are disjoint. The polygons may be assumed to be simple, i.e., they do not include holes. Holes are irrelevant to shorts and may be ignored. A boundary of the layout is assumed to be a rectangle B. One goal is to compute the critical area for shorts in C i.e., to evaluate the integral $$A_c = \int_0^\infty A(r)D(r)dr,$$

where the defect density function is given by Eq.(1). Using typical values for p, q and c, a widely used defect size distribution $D(r)=r_0^2/r^3$ may be derived. (Since $r_0$ is typically smaller than the minimum feature size i.e., smaller than the minimum critical radius, D(r) may be ignored for $r<r_0$). A(r) denotes the area of the critical region for square defects of radius r. The critical region for radius r is the locus of points such that if the center of a square defect of radius r is placed, the square defect causes a short i.e., the defect overlaps with two polygons in different nets.

Assuming a 2nd order L Voronoi diagram of C is given (with the modification described above to accommodate polygons of the same net), the 2nd order diagram essentially provides a partitioning of the plane into regions where critical area is easy to compute. The points of intersection of to the boundary B with the Voronoi diagram are regarded as a Voronoi edge and is referred to as a boundary edge. Note that boundary edges are only bounding Voronoi cells and do not have regions of their own.

For a (2nd order) Voronoi cell V, A(r,V) denotes the area of the critical region for defect radius r within V. Then A(r), the total area of the critical region for defect radius r, is the summation of A(r,V) for every Voronoi cell V. The total critical area is:

$$A_c = \int_0^\infty A(r)D(r)dr \qquad \text{EQ. 2}$$
$$= \int_0^\infty \sum_V A(r, V)D(r)dr$$
$$= \sum_V \int_0^\infty A(r, V)D(r)dr.$$

Let $A_c(V)$ denote the critical area within Voronoi cell V i.e., from EQ 2. Then $Ac=\Sigma_V Ac(V)$. In other words, the total critical area may be calculated by computing the critical area within every (2nd order) Voronoi cell and adding up the results. Focusing first on computing critical area within a single (2nd order) Voronoi cell V having as owner an edge e. Assuming without loss of generality that e is a vertical edge. Since the edges of V are bisectors induced by e they must be vertical or 45°. If V is incident to the boundary B then it may be bounded by a horizontal boundary edge which can be ignored as will be described below.

Figure 7:
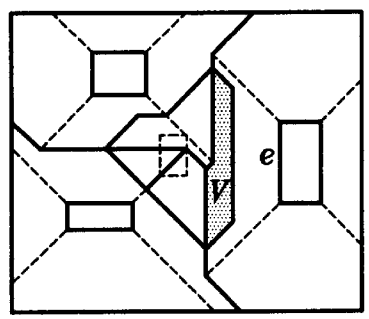
FIG. 7 is a second order $L_\infty$ Voronoi diagram for a vertical edge e in accordance with the present invention.

Referring to FIG. 7, a shaded region illustrates a 2nd order Voronoi cell V of vertical edge e.

Figure 8A:
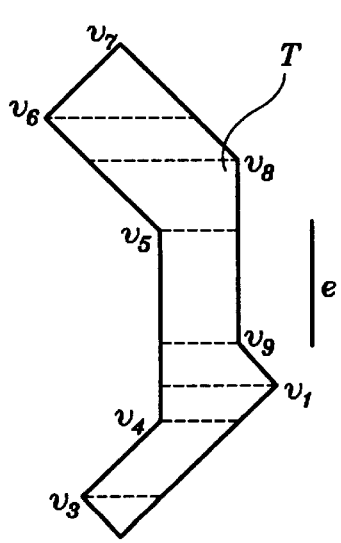
FIGS. 8a–b illustrate decomposition of regions in accordance with the present invention.
Figure 8B:
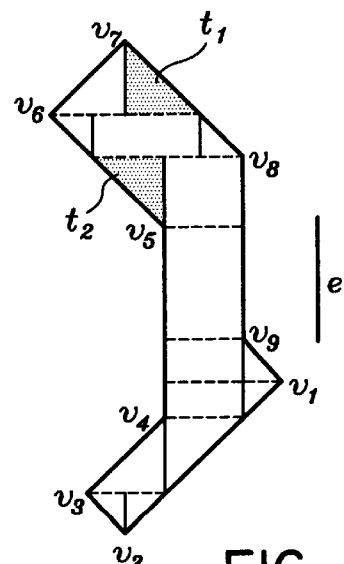

Consider a decomposition of V into trapezoids by drawing the horizontal lines emanating from the Voronoi vertices of V as shown in FIG. 8a. Each trapezoid T can be further decomposed into triangles and at most one rectangle R by drawing the vertical lines through its vertices, as illustrated in FIG. 8b. (In case T is a slanted parallelogram continue the decomposition recursively. Note that the hypotenuse of the triangles (if any) is portion of a 45° Voronoi edge. Note that the (2nd order) Voronoi cell of a horizontal edge e' is decomposed into trapezoids by drawing vertical lines through its vertices. Two kinds of triangles are distinguished in the above decomposition depending on the relevant position with respect to e of their vertical edge and opposite apex. If the apex lies between e and the vertical edge (comparing abscissas) the triangle is called diverging; otherwise it is called converging. In FIG. 8, a first triangle t1 is diverging and a second triangle t2 is converging. Given two vertices $v_j$ and $v_k$ such that $v_j$ is closer to e than $v_k$, let $r_j$, $r_k$ denote the corresponding critical defect radii i.e., $r_j = x_e - x_j$ and $r_k = x_e - x_k$ where $s_j$, $x_k$ and $x_e$ denote the x-coordinates $v_j$, $v_k$ and e respectively.

Consider a rectangle R, a diverging triangle $T_{div}$, and a converging triangle $T_{cnv}$, in the above decomposition of T. Using $D(r) = r_0^2/r^3$ and algebraic manipulation we derive the following formulas for the critical area within R, $T_{div}$, and $T_{cnv}$.

Property 1

The critical area within R, a diverging triangle, $T_{div}$ and a converging triangle, $T_{cnv}$ using the "$r_0^2/r^3$" defect density distribution is given by the following formulas:

$$A_c(R) = \frac{r_0^2}{2}\left(\frac{l}{r_j} - \frac{l}{r_k}\right) \quad \text{EQ. 3}$$

$$A_c(T_{div}) = \frac{r_0^2}{2}\left(\ln\left(\frac{r_k}{r_j}\right) + \frac{l}{r_k}\right) \quad \text{EQ. 4}$$

$$A_c(T_{cnv}) = \frac{r_0^2}{2}\left(\frac{l}{r_j} - \ln\left(\frac{r_k}{r_j}\right)\right) \quad \text{EQ. 5}$$

where l is the size of the vertical side of R, $T_{div}$ and $T_{cnv}$, and $r_k$, $r_j$, $r_k > r_j$ are the maximum and the minimum critical radius of their vertices.

The critical area is derived within V by adding up the critical areas within every rectangle and triangle in the above decomposition of V. Because of the summation, terms of the form $1/r$ corresponding to internal decomposition edges cancel out, as well as logarithmic terms involving endpoints of the decomposition other than Voronoi vertices. the edges of V may be identified or classified as red or blue to make a distinction therebetween as follows. A vertical Voronoi edge is classified as red (respectively blue) if the interior V and the owner e lie at opposite sides (respectively the same side) of the Voronoi edge. A 45° edge incident to a diverging triangle is classified as or colored red while a 45° edge incident to a converging triangle is classified as blue. The same classification is used for boundary edges. A vertical boundary edge of V (if any) is colored blue. A horizontal boundary edge is equivalent to a horizontal decomposition edge and does not get involved in the formulas of Property 1; in other words, it receives no classification and is irrelevant to the critical area computation (assuming that the owner e is vertical). In the formulas of Property 1, terms corresponding to red edges get added while terms corresponding to blue edges get subtracted. The Voronoi edges bounding the cell of a horizontal edge are classified similarly.

To derive the total critical area for the layout, the critical areas are added within every (2nd order) Voronoi cell. Every Voronoi edge bounds exactly two cells and receives the same coloring (red or blue) with respect to both cells. Boundary edges bound exactly one cell and their classification is blue or they are unclassified. The following results.

Result 1

Given the 2nd order $L_\infty$ Voronoi diagram of rectilinear polygons of a layer in a circuit layout C and assuming that defects are squares following the "$r_0^2/r^3$" defect density distribution, the critical area for shorts in that layer is given by the following formula:

$$A_c = \quad \text{EQ. 6}$$

$$r_0^2\left(\sum_{red\ e_i}\frac{l_i}{r_i} - \sum_{blue\ e_i}\frac{l_i}{r_i} + \sum_{red\ e_{45}}\ln\left(\frac{r_k}{r_j}\right) - \sum_{blue\ e_{45}}\ln\left(\frac{r_k}{r_j}\right) - \frac{1}{2}\sum_{blue\ b_i}\frac{l_b}{r_b}\right)$$

where $l_i$ and $r_i$ denote the length and the critical radius of an orthogonal Voronoi edge, $r_k$, $r_j$, $r_k > r_j$ denote the maximum and the minimum critical radius of a 45° Voronoi edge, and $l_b$, $r_b$ denote the length and the critical radius of a boundary edge. The first two summations are taken over all red and all blue orthogonal Voronoi edges respectively. The third and forth summations are taken over all red and all blue 45° Voronoi edges respectively. The last summation is taken over all blue boundary edges.

Thus, in accordance with the present invention, the critical area problem for shorts in a rectilinear layout is reduced to the 2nd order Voronoi diagram of polygons. The critical area may be written as a function of Voronoi edges and thus it may be computed analytically once the (2nd order) Voronoi diagram is available. As it will be shown hereinbelow, this result also holds for layouts including 45° edges and for generalizations for arbitrary shapes.

Referring to FIG. 9, a sweep line or plane algorithm is provided for computing the $L_\infty$ Voronoi diagram for n rectilinear polygons. Rectangles are considered here instead of rectilinear polygons for simplicity. The same algorithm may be generalized to rectilinear layouts, however. The time complexity for the algorithm is O(nlogn) and it is based on a wavefront paradigm for the Voronoi diagram of points, introduced in an article by F. Dehne and R. Klein, "The Big Sweep: On the power of the Wavefront Approach to Voronoi Diagrams," Algorithmica (1997), 17, 19–32 incorporated herein by reference.

A vertical sweep line L is applied sweeping across the entire plane from left to right. The set of rectangles at any instant of the sweeping process will be partitioned into three subsets, $S_l$, $S_m$ and $S_r$, corresponding to those that lie totally to the left of L, intersect L, and lie totally to the right of L, respectively. As shown FIG. 10, $S_l$, $S_m$ and $S_r$ are shown darkly shaded, lightly shaded, and unshaded, respectively. The sweep line L, which is cut by the rectangles in $S_m$, is decomposed into $|S_m|+1$ sweep line segments, two of which are unbounded. Each such sweep line segment is considered to be the left edge of a moving rectangle.

Figure 10:
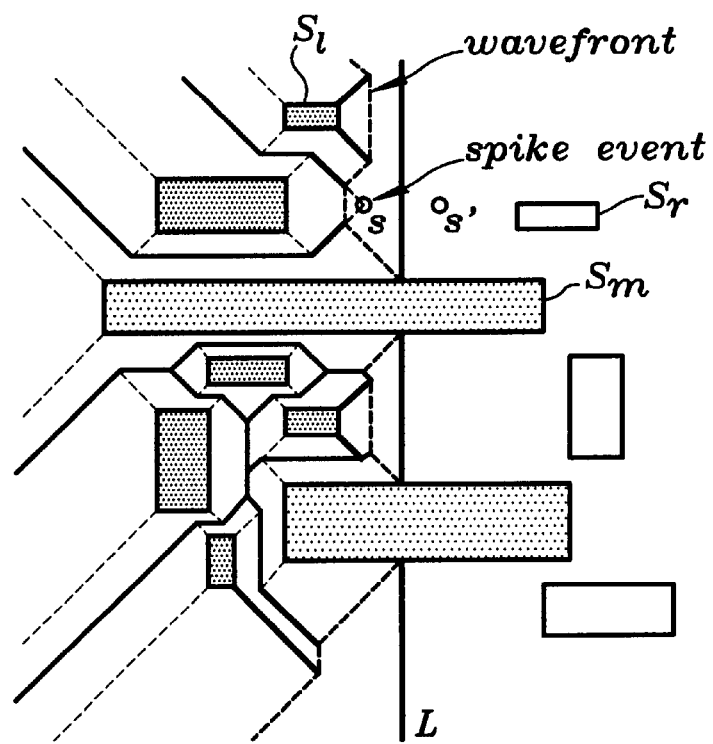
FIG. 10 illustrates construction of a Voronoi diagram for a layout using a plane sweep method in accordance with the present invention.

A partial Voronoi diagram computed already is maintained for the rectangles in $S_f$, the portion of the rectangles in $S_m$, that lie to the left of L, and the sweep line segments. At any instant of the sweeping process the boundary of the Voronoi cell associated with a single sweep line segment is called a wavefront curve and includes bisectors induced by the sweep line segment. The collection of the wavefront curves for all sweep line segments is referred to as the wavefront. As shown in FIG. 10, the wavefront is shown in dashed-lines. The Voronoi edges that have an endpoint common with the wavefront are called spike bisectors and are shown in solid and thicker lines in FIG. 10. As the sweep line moves to the right, the wavefront will shift to the right and as will the spike bisectors. Associated with the plane sweep algorithm, there are two major components: an event list and a sweep line status. The event list, implemented as a priority queue Q, includes abscissae, called priority values, at which the sweep line status will change. The sweep line status, implemented as a height-balanced binary tree T, implicitly maintains the wavefront. In particular, the sweep line status includes the spike bisectors and the north and south edges of the rectangles in $S_m$. The ordering follows the order of the wavefront.

To simulate the wavefront movement to the right as the plane sweep proceeds the endpoints spike bisectors are parameterized with respect to the abscissa of the sweep line called t. In other words, the abscissa of the endpoint of a spike bisector is kept as a linear function of t. This function can be easily derived by the property that the endpoints must be equidistant (in $L_\infty$) from the sweep line and the owners of the spike bisector. The abscissa of the endpoint of a north or south edge in T is given by t. At any instant t, the wavefront is the polygonal line connecting the endpoints of the elements of T.

In the event list, the events where the sweep line status changes are kept. The events are of two kinds: 1) events corresponding to vertical edges of rectangles referred to as edge events and 2) events corresponding to the intersection point of two neighboring spike bisectors referred to as spike events. The priority value of an edge event is the abscissa of the edge. A spike event corresponds to a potential Voronoi vertex that may or may not appear in the final Voronoi diagram. The priority value of a spike event s of abscissa $x_s$ is $x_s + d(e_j, s)$, where $e_j$ is the owner of s (s∈reg($e_j$)). For example, in FIG. 10, the spike event associated with the potential Voronoi vertex s has as priority value the abscissa of the point marked as s'. In other words, the spike event corresponding to s occurs when the sweep line reaches s'.

Initially, the event list Q includes all the abscissae of the west and east edges of the set of rectangles, and the sweep line status T is empty. L is swept across the plane in ascending order of the abscissae, stopping at each event point of a certain priority value. When there is more than one abscissa that corresponds to west or east edge of a rectangle, a tie-breaking convention may be adopted. for example, an east edge always precedes a west edge, and if the edges are of the same type, the one with the smaller ordinate will be processed first.

Three cases for handling the event points are described as follows. For brevity, let $R_i^s$, $R_i^n$, $R_i^e$, $R_i^w$ denote the south, north, east and west edges of a rectangle $R_i$. The bisector between two consecutive edges of $R_i$ is a 45° ray emanating from the corner vertex outwards. The bisector of any two edges $e_k$, $e_j$ is denoted as $B(e_k,e_j)$.

1. Left edge of rectangle $R_i$. The following case is described with reference to FIG. 11. Let the edge be denoted a,b where a and b are the northwest and southwest corners of $R_i$ respectively. Bisectors $B(R_i^w, R_i^n)$ and $B(R_i^s, R_i^w)$ are constructed.

Figure 11:
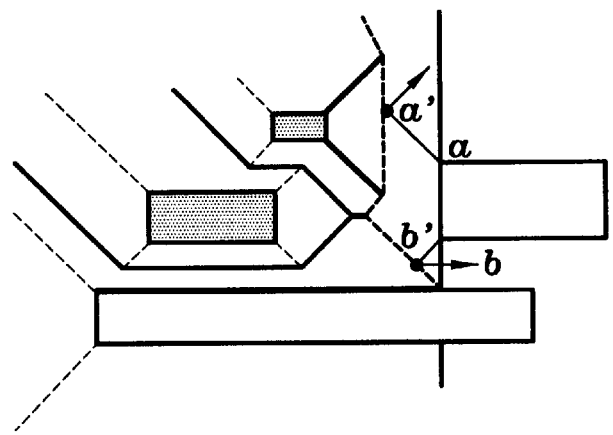
FIG. 11 illustrates a left edge event in a layout during the plane sweep method in accordance with the present invention.

(a) Identify the intersection points a' and b' of $B(R_i^w, R_i^n)$ and $B(R_i^s, R_i^w)$ with the wavefront respectively. This can be done by binary search in T for each bisector. The binary search proceeds by discriminating the endpoints of the elements of T against the bisector. The goal is to identify the pair of consecutive elements in T whose endpoints lie at opposite sides of the bisector. Then a' and b' can be easily identified as the intersection points of the respective bisector and the segment joining the corresponding pairs of endpoints. As shown in FIG. 11, the elements of T are depicted as thickened lines. Let $e_a$ and $e_b$ denote the edges owning a' and b'.

(b) Update the Voronoi diagram constructed so far by explicitly constructing the portion of the wavefront between a' and b'. Recall that this corresponds to the line segments joining the endpoints of the elements of T between a' and b'.

(c) Update T by removing those spike bisectors between a' and b'. The spike events associated with these spike bisectors can be either deleted from the priority queue now or ignored later when they get extracted from the priority queue.

(d) Two new spike bisectors $B(e_a, R_i^n)$ and $B(R_i^s, e_b)$ are created with start points a' and b' respectively. Moreover, at most two new spike events defined by the intersection of bisector $B(R_i^s, e_b)$ and its lower neighbor and by the intersection of bisector $B(e_a, R_i^n)$ and its upper neighbor will be created and inserted to the priority queue. Note that the priority values of these spike events should be recorded correctly.

(e) Update T by inserting $R_i^n$ and $R_i^s$, and the new spike bisectors $B(e_a, R_i^n)$ and $B(R_i^s, e_b)$. In FIG. 11, these two new spike bisectors, $B(e_a, R_i^n)$ and $B(R_i^s, e_b)$ are shown with an arrowhead.

Figure 12:
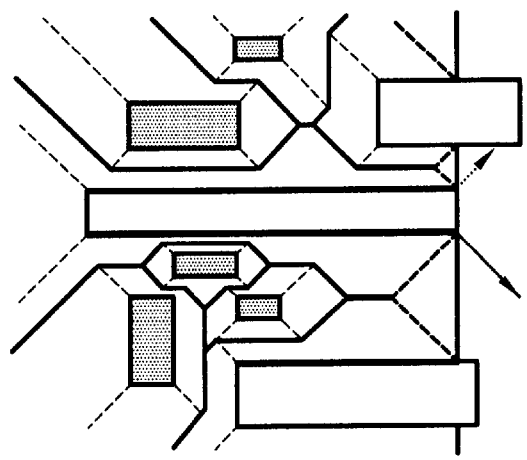
FIG. 12 illustrates a right edge event in a layout during the plane sweep method in accordance with the present invention.

2. Right edge of rectangle $R_i$. The following case is described with reference to FIG. 12. In this case the two elements $R_i^s$ and $R_i^n$ should be present in T in consecutive order. These two elements in T need to be deleted from T and replaced by two new bisector elements, $B(R_i^e, R_i^s)$ and $B(R_i^n, R_i^e)$ respectively (shown with arrowheads in FIG. 12). As in case 1.(d), these two newly created bisectors should be checked against their neighboring elements to see if they would create spike events to be inserted in the priority queue with the appropriate priority values.

Figure 13:
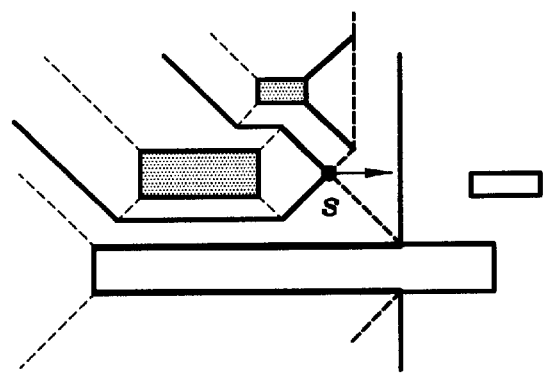
FIG. 13 illustrates a spike event in a layout during the plane sweep method in accordance with the present invention.

3. Spike event s. The following case is described with reference to FIG. 13. s is the intersection of two spike bisectors, say, $B(R_k^u, R_j^v)$ and $B(R_j^v, R_i^z)$ for some wavefront rectangles $R_i$, $R_j$, $R_k$ where u, v, z stand for north, east or south. If either of the two bisectors is not currently in T (due to case 1.(c)) then we discard s, as it is no longer relevant. Otherwise, the two bisectors $B(R_k^u, R_j^v)$ and $B(R_j^v, R_i^z)$ are adjacent in T. Both bisectors should be deleted from T and replaced by a new spike bisector $B(R_k^u, R_i^z)$. (The Voronoi cell of their common owner $R_j^v$ becomes part of the final diagram). This new spike bisector should be checked against its neighboring elements for possible intersections thereby creating spike events to be inserted in the priority queue with the appropriate priority values.

Property 2

The Voronoi diagram in the $L_\infty$-metric for a set of rectangles can be computed in O(n log n) time.

The number of event points, including spike events, is O(n), and the number of elements maintained in the sweep line status is also O(n). The operation associated with each event point takes O(log n) time, giving rise to an overall time complexity of O(n log n). The correctness of the algorithm follows from the result of Dehne and Klein referenced hereinabove.

Once the Voronoi diagram is available, the 2nd order subdivision within each Voronoi cell is computed in a similar fashion.

Referring to FIG. 14, the 2nd order partitioning in the Voronoi cell of the middle rectangle $R_o$ is shown. The Voronoi cell of $R_o$ is shown lightly hatched. The partitioning line segments are depicted in thicker lines, and they are just extensions of those Voronoi edges that are incident on a Voronoi vertex on the boundary of reg($R_o$). The owners of the 2nd order cells, drawn in thicker lines, are rectangle edges that are associated with the Voronoi edges on the boundary of reg($R_o$). The computation of the 2nd order subdivision is done independently in every Voronoi cell.

Concentrating on the computation of a single cell, say reg($R_o$), the neighboring cells and the edges are identified such that, together with an edge of $R_o$, define a Voronoi edge on the boundary of reg($R_o$). These are the only edges involved in the computation of the 2nd order partition within the Voronoi cell of $R_o$. The identification can be done from the Voronoi edges bounding reg($R_o$), by simply computing the Voronoi diagram of these edges and truncating the Voronoi diagram within the interior of reg($R_o$). As before, use of a vertical sweep line sweeping from left to right is performed. The abscissae of the endpoints of site edges is sorted in ascending order and placed in the event-list. The sweep line status includes at most two edges of a rectangle, one south edge and one north edge (since only one cell is being partitioned), plus a number of spike bisectors. As before, the adjacent elements in the sweep line status induce spike events which correspond to potential Voronoi vertices. The handling of the event points is substantially the same. Once the Voronoi cell of one edge is computed, the Voronoi cell gets truncated by the boundary of reg($R_o$). A Voronoi edge is always truncated by the incident Voronoi vertex along the boundary of reg($R_o$). The time complexity and the correctness of this algorithm follow as described above.

A data structure to store the Voronoi diagram may be any standard data structure for planar subdivisions. For example, a doubly connected edge list or the quad edge data structure. However, for the critical area computation there is no need to explicitly maintain the Voronoi diagram. As the plane sweep proceeds, as soon as an individual Voronoi cell is computed, the 2nd order subdivision within the cell may be directly computed and the portion of critical area due to that cell may be derived. Linked lists data structures are thus sufficient.

Referring to FIGS. 15a and 15b, the present invention is extended to ortho-45 layouts i.e., layouts containing shapes with edges of slope ±1 in addition to orthogonal edges.

The $L_\infty$ Voronoi diagram of ortho-45 polygons includes edges in eight orientations: vertical, horizontal, (±1)-slope, (±⅓)-slope and (±3)-slope lines. FIG. 15a illustrates the $L_\infty$ Voronoi diagram of ortho-45 shapes. Unlike the rectilinear case, now there are vertices that have Voronoi cells of there own. These are vertices incident to two 45° edges and vertices incident to acute angles. Within the Voronoi cell of a vertex v, distance is measured according to the vertical or horizontal distance from v depending on which quadrant of point v that contains the cell. Thus, within reg(v), v can be regarded as a horizontal or vertical edge respectively of length zero. (Recall that the four 45° rays emanating from a point p partition the plane into four quadrants where distance simplifies to vertical or horizontal, see FIG. 3). FIG. 15b illustrates the 2nd order subdivision within the cell of polygon P.

The decomposition into rectangles and triangles of the Voronoi cell of a vertical or horizontal edge (or vertex) is obtained similarly as described above for the rectilinear shapes. Moreover, Voronoi edges are classified into red and blue in the same manner. The only difference now is that the hypotenuse of some orthogonal triangles may have slope ±3 or ±⅓ in addition to ±1. Thus, the formulas of Property 1 for non-isosceles triangles get slightly modified as follows.

Property 3

The critical area within a non-isosceles diverging triangle $T_{div}$, and a non-isosceles converging triangle $T_{cnv}$, in the decomposition of the (2nd order) Voronoi cell of an orthogonal edge is given by the following formulas, using the "$r_0^2/r^3$" defect density distribution:

$$A_c(T_{div}) = \frac{r_0^2}{2}\left(3 \ln\left(\frac{r_k}{r_j}\right) - \frac{l}{r_k}\right) \quad \text{EQ. 7}$$

$$A_c(T_{cnv}) = \frac{r_0^2}{2}\left(\frac{l}{r_j} - 3 \ln\left(\frac{r_k}{r_j}\right)\right) \quad \text{EQ. 8}$$

where l is the size of the edge of $T_{div}$ and $T_{cnv}$ parallel to e, $r_k$, $r_j$, $r_k > r_j$ are the maximum and the minimum critical radius of their vertices.

The difference from the derivation of Property 1 is that l=3w, where l, w are the length of the vertical and the horizontal edge of $T_{cnv}$ and $T_{div}$, respectively. (Note that the slope of the hypotenuse is ±3 for a vertical owner and ±⅓ for a horizontal owner.) For a defect radius r, $r_j < r \leq r_k$, $l_r = 3w_r$, i.e., $l_r = 3(r - r_j)$. The formulas follow in the same fashion as Property 1.

Figure 16:
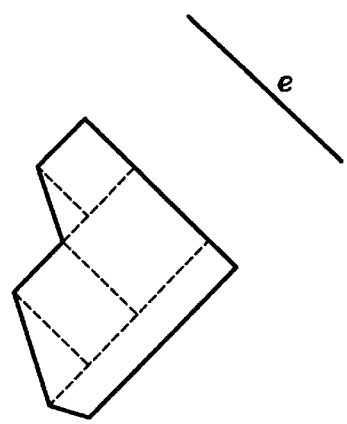
FIG. 16 illustrates decomposition of a Voronoi cell of a 45° edge in accordance with the present invention.

For a (2nd order) Voronoi cell V of a (−1)-slope edge e, the decomposition of V into trapezoids is obtained by drawing lines of slope +1 from the vertices of V. The decomposition of each trapezoid into triangles and rectangles is obtained by drawing (−1)-slope lines from its vertices. Triangles are characterized as diverging or converging similarly as described above. As shown in FIG. 16, the decomposition for the cell of a (−1)-slope edge in a Voronoi diagram is illustrated. Similarly for the Voronoi cell of (+1)-slope edge. The formulas of Property 1 for Voronoi cells of 45° edges are modified as follows.

Property 4

The critical area within a rectangle R, a diverging triangle $T_{div}$, and a converging triangle $T_{cnv}$ in the decomposition of the (2nd order) Voronoi cell of a 45° edge is given by the following formulas, using the "$r_0^2/r^3$" defect density distribution:

$$A_c(R) = \frac{r_0^2}{\sqrt{2}}\left(\frac{l}{r_j} - \frac{l}{r_k}\right) \quad \text{EQ. 9}$$

$$A_c(T_{div}) = \frac{r_0^2}{\sqrt{2}}\left(t\sqrt{2} \ln\left(\frac{r_k}{r_j}\right) - \frac{l}{r_k}\right) \quad \text{EQ. 10}$$

$$A_c(T_{cnv}) = \frac{r_0^2}{\sqrt{2}}\left(\frac{l}{r_j} - t\sqrt{2} \ln\left(\frac{r_k}{r_j}\right)\right) \quad \text{EQ. 11}$$

where l is the size of the edge of R, $T_{div}$ and $T_{cnv}$, parallel to e, $r_k$, $r_j$, $r_k > r_j$ are the maximum and the minimum critical radius of their vertices, and t is a factor reflecting the slope of the hypotenuse; t=2 if the hypotenuse has slope ±3, ±⅓, and t=1 otherwise.

The Voronoi edges of cell V are colored red and blue in a manner similar to the rectilinear case. However, there may be 45° edges that do not contribute to the formulas of Property 4 which are not colored. In particular, 45° Voronoi edges parallel to the owner e are colored red if the interior and the owner of the cell lies on opposite sides of the edge; otherwise they are colored blue. 45° Voronoi edges perpendicular to the owner are unclassified with respect to this owner and they do not contribute to critical area within V. Unclassified edges are colored neutral. The remaining Voronoi edges of V induce the hypotenuse of a triangle and they are colored red or blue depending on whether the triangle is diverging or converging, respectively. Any boundary edges bounding V are colored blue.

As in the rectilinear case, the total critical area is derived by adding the critical areas within every (2nd order) Voronoi cell. Every Voronoi edge bounds exactly two cells and receives the same coloring (with the exception of neutral) with respect to both cells. Note that an edge may be colored red (respectively, blue) with respect to one cell and neutral with respect to the other. We generalize Result 1 as follows. The term prime is used to denote Voronoi edges that are parallel to their owner i.e., Voronoi edges corresponding to bisectors of parallel edges.

Result 2

Given the 2nd order $L_\infty$ Voronoi diagram of polygons in an ortho-45 layer of a circuit layout C and assuming that defects are squares following the "$r_0^2/r^3$" defect density distribution, the critical area for shorts in that layer is given by the following formula:

$$A_c = r_0^2 \left( \sum_{\substack{red, \\ prime\ e_i}} h_i \frac{l_i}{r_i} - \sum_{\substack{blue, \\ prime\ e_i}} h_i \frac{l_i}{r_i} + \sum_{\substack{red, \\ non\text{-}prime\ e_j}} f_j \ln\left(\frac{r_k}{r_j}\right) - \sum_{\substack{blue, \\ non\text{-}prime\ e_j}} f_j \ln\left(\frac{r_k}{r_j}\right) - \frac{1}{2} \sum_{\substack{blue, \\ prime\ b_i}} \frac{l_b}{r_b} - \sum_{\substack{blue, \\ non\text{-}prime\ b_j}} \ln\frac{r_k}{r_j} \right) \quad \text{(EQ. 12)}$$

where $l_i$ and $r_i$ denote the length and the critical radius of a prime Voronoi edge, $r_k$, $r_j$, $r_k > r_j$ denote the maximum and the minimum critical radius of a non-prime Voronoi (or boundary) edge, and $l_b$, $r_b$ denote the length and the critical radius of a boundary edge. Factor $h_i=1$ for orthogonal prime Voronoi edges and $h_i=\sqrt{2}$ for 45° prime Voronoi edges. Factor $f_i=1, 2, ½, 7/2$, depending on the slope of the Voronoi edge and its owners. In particular, $f_i=1$ for a 45° Voronoi edge with orthogonal owners, $f_i=½$ for a 45° Voronoi edge with a 45° owner, $f_i=2$ for an orthogonal Voronoi edge of 45° owners, and $f_i=7/2$ for a (±3, ±⅓)-slope Voronoi edge. The first two summations are taken over all red and all blue prime Voronoi edges, respectively. The third and forth summations are taken over all red and all blue non-prime Voronoi edges, respectively. The last two summations are taken over all blue boundary edges, the former over prime boundary edges and the latter over non-prime ones.

By summing up critical areas within every (2nd order) Voronoi cell terms corresponding to internal decomposition vertices or edges cancel out. By the equations of property 4 prime 45° Voronoi edges contribute $$\frac{\sqrt{2}}{2} \frac{l_i}{r_i}$$

to the critical area for each owner while the orthogonal prime Voronoi edges contribute $$\frac{1}{2} \frac{l_i}{r_i}.$$

Thus, the values of $h_i$ can be derived.

The values of factor $f_i$ are derived as follows. For a 45° non-prime Voronoi edge with orthogonal owners $f_i$ is clearly 1 (as in the rectilinear case). A 45° non-prime Voronoi edge induced by a 45° owner and an orthogonal edge contributes 0 to critical area for the 45° owner (it is colored neutral) and $$\frac{1}{2} \ln\frac{r_k}{r_j}$$

for the orthogonal owner. Thus $f_i=½$. An orthogonal Voronoi edge of 45° owners contributes $$\ln\frac{r_k}{r_j}$$

for each owner (see EQs. of property 4) thus, $f_i=2$ in this case. A (±3, ±⅓)-slope Voronoi edge contributes $$\frac{3}{2} \ln\frac{r_k}{r_j}$$

because of its orthogonal owner (property 3) and $$2\ln\frac{r_k}{r_j}$$

because of 45° owner (property 4). Thus, $f_i=7/2$. The terms for boundary edges are derived similarly.

Figure 17A:
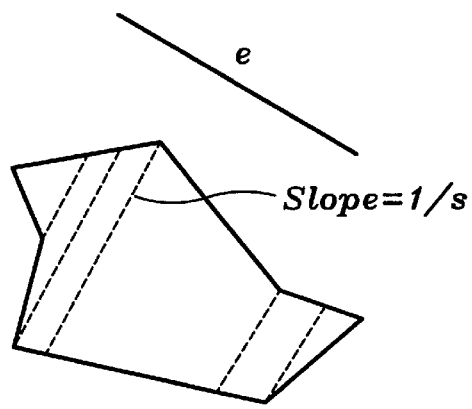
FIGS. 17a–c illustrate decomposition of a Voronoi cell into trapezoids in layouts with shapes of arbitrary orientations in accordance with the present invention
Figure 17B:
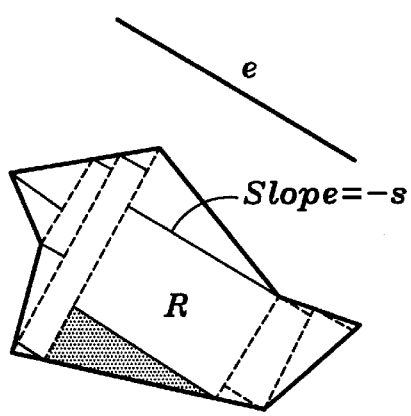
Figure 17C:
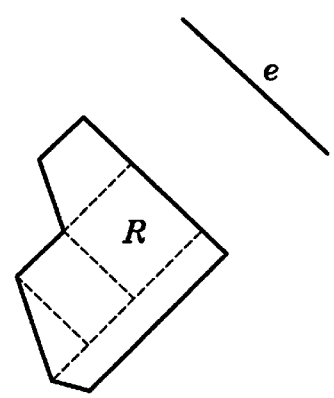

Referring to FIGS. 17a–c, critical area computation in layouts of shapes in arbitrary orientations is illustrated. For a layer in a circuit layout including a collection of disjoint simple polygons C in arbitrary orientations. One goal is to compute the critical area for shorts i.e., as described above.

Assuming a 2nd order Voronoi diagram is given, concentrating on a single (2nd order) Voronoi cell V having as owner an edge e of slope ±s, s≧0. The Voronoi cell of a vertex is considered as the Voronoi cell of a vertical or horizontal edge. Consider a decomposition of V into trapezoids by drawing lines perpendicular to e (lines of slope ±1/s) emanating from the Voronoi vertices of V (see FIG.

17a). Each trapezoid T, for example, is further decomposed into orthogonal triangles and at most one rectangle R by drawing lines parallel to e (slope ±s) through its vertices as shown in FIGS. 17 b–c. (In case T is a slanted parallelogram continue the decomposition recursively). As described above two kinds of triangles are distinguished, diverging and converging, depending on the relevant position of the hypotenuse and the orthogonal apex with respect to e. In particular, if the owner e and the orthogonal apex lie on opposite sides of the hypotenuse the triangle is classified as diverging, otherwise it is classified converging.

Given two vertices $v_j$ and $v_k$ such that $v_j$ is closer to e than $v_k$, let $r_j$, $r_k$ denote the corresponding critical defect radii i.e., the $L_\infty$ distance of $v_j$ and $v_k$ from the line 1 through e respectively. The following formulas are derived for the critical area within an element of the above decomposition.

Property 5

The critical area within a rectangle R, a diverging triangle $T_{div}$, and a converging triangle $T_{cnv}$, is given by the following formulas, using the "$r_0^2/r^3$" defect density distribution:

$$A_c(R) = \frac{r_0^2 S}{2}\left(\frac{l}{r_j} - \frac{l}{r_k}\right) \qquad \text{EQ. 13}$$

$$A_c(T_{div}) = \frac{r_0^2 S}{2}\left(ST\ln\left(\frac{r_k}{r_j}\right) - \frac{l}{r_k}\right) \qquad \text{EQ. 14}$$

$$A_c(T_{cnv}) = \frac{r_0^2 S}{2}\left(\frac{l}{r_j} - ST\ln\left(\frac{r_k}{r_j}\right)\right) \qquad \text{EQ. 15}$$

where l is the size of the edge of R, $T_{div}$, and $T_{cnv}$, parallel to e, $r_k$, $r_j$, $r_k > r_j$ are the maximum and the minimum critical radius of their vertices, $$S = \frac{s+1}{\sqrt{s^2+1}},$$

where s is the absolute value of the slope of e, and $$T = \frac{ts+1}{|t-s|}$$

where t is the absolute value of the slope of the hypotenuse (i.e, the slope of the corresponding Voronoi edge). For s=∞, S=1 and T=t.

The critical area is derived within V by adding up the critical areas within every rectangle and triangle in the above decomposition of V. Because of the summation, terms of the form $Sl/r_1$ corresponding to internal decomposition edges cancel out. Similarly, for logarithmic terms involving endpoints of the decomposition other than Voronoi vertices. Thus, the critical area within V can be written as a function of Voronoi edges. The Voronoi edges that induce the hypotenuse of diverging triangles are colored as red and those inducing the hypotenuse of converging triangles as blue. Voronoi edges that are incident to a rectangle or induce an orthogonal edge of a triangle should be either parallel or perpendicular to the owner of the cell. Those Voronoi edges that are parallel to the owner are referred to as prime and they are portions of bisectors of two parallel edges. Prime Voronoi edges are colored red if the interior and the owner of the cell are on opposite sides of the edge; otherwise they are colored blue. Those Voronoi edges that are perpendicular to the owner are colored neutral i.e., they are not colored with respect to that cell. In the formulas of Property 5, terms corresponding to red edges get added while terms corresponding to blue edges get subtracted. Neutral edges do not contribute in the formulas. The boundary of the layout is assumed to be a rectangle. The intersection points of the boundary with the Voronoi diagram are treated as Voronoi vertices. Boundary edges are treated as Voronoi edges, but they contribute only one time in the formulas presented.

Result 3

Given the 2nd order $L_\infty$ Voronoi diagram of polygons of a layer in a circuit layout C and assuming that defects are squares following the "$r_0^2/r^3$" defect density distribution, the critical area for shorts in that layer is given by the following formula:

$$A_c = r_0^2 \left( \sum_{\substack{red,\\prime\ e_i}} \frac{S_i l_i}{r_i} - \sum_{\substack{blue,\\prime\ e_i}} \frac{S_m l_m}{r_m} + \frac{1}{2}\sum_{\substack{red,\\non\text{-}prime\ e_j, wrt\ e}} S_e^2 T_e \ln\left(\frac{r_k}{r_j}\right) - \frac{1}{2}\sum_{\substack{blue,\\non\text{-}prime\ e_j, wrt\ e}} S_e^2 T_e \ln\left(\frac{r_k}{r_j}\right) + \frac{B}{2} \right) \qquad \text{EQ. 16}$$

where $l_i$ and $r_i$ denote the length and the critical radius of a prime Voronoi (or boundary) edge $e_i$, and $r_k$, $r_j$, $r_k > r_j$ denote the maximum and the minimum critical radius of a non-prime Voronoi (or boundary) edge $e_j$. The factors $S_e$, and $T_e$, are as defined in Property 5 for each owner e of the non-prime edge $e_j$. B is the sum of the blue terms for prime boundary edges of a rectangle enclosing the layout C and appears as a correcting factor since boundary edges should be considered only once.

A sweep line algorithm for the $L_\infty$ Voronoi diagram of general shapes is provided. The algorithm is used to compute the Voronoi diagram of segments (or shapes) in arbitrary orientations. The algorithm is a generalization of the algorithm presented above for rectangles and is based on the plane sweep paradigm for points as described. Before discussing the algorithm, some combinatorial details are set forth for the $L_\infty$ Voronoi diagram of segments.

Property 6

The $L_\infty$ bisector of two non-vertical lines $l_1$ and $l_2$ of slopes $b_1$, and $b_2$, respectively, includes two lines (L1 and L2) as shown in FIGS. 18a–b and described as follows:

If $b_1 \geq b_2 \geq 0$ the bisector includes two lines of slopes $-1$ and $$\frac{b_1 + b_2 + 2b_1b_2}{b_1 + b_2 + 2}.$$

If $b_1 \leq b_2 \geq 0$ the slopes of the bisector are $+1$ and $$\frac{-b_1 - b_2 + 2b_1b_2}{b_1 + b_2 - 2}.$$

If $b_1>0$ and $b_2<0$ the bisector has slopes $$\frac{b_2 - b_1 + 2b_1b_2}{b_1 + b_2} \text{ and } \frac{b_1 + b_2}{b_1 - b_2 + 2}.$$

Note that if one of these two lines is vertical (i.e., $b_1=\pm\infty$), the $L_\infty$ bisector includes a 45° line and a line of slope $(1+2b_2)$ for $b_2>0$ (respectively, $(-1+2b_2)$ for $b_2<0$). Moreover if $b_2=-b_1$ the bisector is a vertical and a horizontal line and if $b_1=\infty$, $b2=0$ the bisector includes two 45° lines.

Referring to FIGS. 19a–c, the bisector of a point p and a line l ($p \notin l$) consists of at most four parts, one for each quadrant of p. Each part corresponds to the portion of the bisector between L and a vertical or horizontal line through p depending on the quadrant of p. Thus each part is a line segment or ray whose slopes can be derived by Property 6. The unbounded parts of the bisector are always parallel 45° rays (see FIG. 19). For a point p along a non-orthogonal line L the bisector is a 45° line through p. In the case of a point p along a vertical or horizontal line l, the bisector is the area enclosed by the 45° lines through p. For simplicity the boundary of this region is only considered as the bisector between p and l (the two 45° lines); the interior of this region is considered to be closer to p.

The algorithm to compute the Voronoi diagram of a planar straight-line graph is now focused on. Let G be a planar straight-line graph on n points as defined i.e., a set of non-crossing line segments spanned by these points. Compute the $L_\infty$ Voronoi diagram of G, V(G). Consider a vertical sweep line L sweeping across the entire plane from left to right. At any instant t of the sweeping process the sweep line partitions the set of segments (edges) of G into three subsets $S_l$, $S_m$ and $S_r$ corresponding to those that lie totally to the left of L, intersect L, and lie totally to the right of L, respectively. The segments in $S_m$, cut L into $|S_m|+1$ sweep line segments, two of which are unbounded, denoted by $L_t$. Let $S_t$ denote the portions of segments in $S_m$, to the left of L. In other words, $S_t=\{s(t)|s \in S_m,\}$ where s(t) denotes the portion of s to the left of L. At every instant t of the sweeping process, compute the Voronoi diagram of $G_t=S_1 \cup S_t \cup L_t$. Note that at any instant t the sweep line segments are treated as being part of G. (In case G is a collection of simple polygons and it is desired to compute only the Voronoi diagram in the exterior of the polygons, the segments in the interior of polygons are excluded from $L_t$, as shown in FIG. 20).

The boundary of the Voronoi cell of each segment in $L_t$ is referred to as an individual wavefront and the collection of individual wavefronts for all segments in $L_t$ is called the wavefront. As illustrated in FIG. 20, the wavefront is shown in dashed lines. Note that in the case of points the whole wavefront is a single individual wavefront. Clearly, in the $L_\infty$ metric the wavefront is y-monotone. The Voronoi edges that have an endpoint common with the wavefront are called spike bisectors.

As the plane sweep proceeds, the wavefront, and therefore the endpoints of spike bisectors, as well as the endpoints of segments in $S_t$ move continuously to the right until an event takes place which causes the wavefront to change. An event may cause a wave (i.e. a line segment of the wavefront) to disappear or a new wave to appear. Two kinds of events include: 1) events corresponding to the occurrence of a vertex or a vertical edge in G, referred to as site events and 2) events corresponding to the intersection point of two neighboring spike bisectors, referred to as spike events. A site event induced by a point p takes place at $t=x_p$, where $x_p$ is the abscissa of point p, i.e., as soon as the sweep line L reaches p. A spike event Z takes place at $t=x_z+w$ where $x_z$, is the abscissa of the intersection point and w is the distance of the intersection from the inducing element i.e., when the intersection point becomes equidistant from the sweep line and the elements defining the spike bisectors. Clearly, at a spike event, the wave sliding along the two spike bisectors disappears from the wavefront. The intersection point of the spike bisectors becomes a Voronoi vertex of the final Voronoi diagram. At a site event, at least one new wave is generated while some wave may disappear.

Throughout the plane sweep the wavefront in a data structure referred to as the sweep line status is implicitly maintained. The sweep line status is implemented as a height-balanced binary tree T. In particular, the sweep line status includes the spike bisectors and the edges in $S_t$. Along with every spike bisector the identities of the two elements generating the bisector are recorded, its starting point, and its endpoint. To simulate the wavefront movement to the right the endpoints of spike bisectors and segments in $S_t$ are parameterized as linear functions of t. In particular, for the endpoint q of a spike bisector its function is derived from the equation of the horizontal distance of q to L and the $L_\infty$, distance of q to the owners of the bisector. The endpoint of an edge in $S_t$ is given by t.

The elements of the sweep line status are ordered according to the sequence of their induced waves in the wavefront. Because of the y-monotonicity of the wavefront this coincides with the order of the ordinates of the parameterized endpoints. Note that a spike event occurs when the endpoints of two neighboring spike bisectors become coincident. At any instant t the wavefront is the polygonal line obtained by connecting the endpoints of the elements in T in increasing y-coordinate value. The events are organized in a priority queue referred to as the event list in increasing priority value.

Figure 21A:
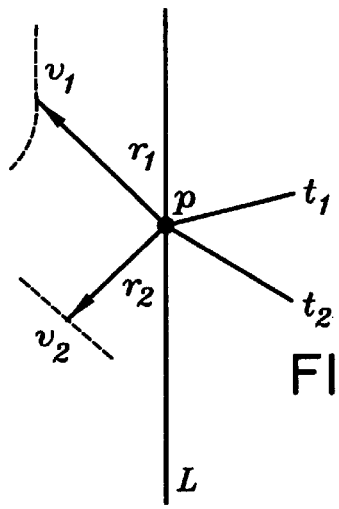
FIGS. 21a–c illustrate handling a site event during the sweeping process.

The event points are handled in the plane sweep algorithm to compute the Voronoi diagram of the planar straight line graph G. Let p be a site event corresponding to point p. Let $S(p)=\{s_1, s_2, \ldots, s_k\}$ and $T(p)=\{t_1, t_2, \ldots, t_k\}$ denote the segments of G incident to p to the left and to the right of L, respectively, both including any vertical segments. (If p is incident to a vertical edge, the vertical edge is included in both S(p) and T(p)). S(p) and T(p) are ordered counterclockwise and clockwise respectively around p starting at L as shown in FIG. 21. The vertical and the horizontal axes at p partition the plane into four quadrants.

The following is then performed:
1. Determine the portion of the wavefront that becomes part of the final Voronoi diagram.
   (a) If S(p) is empty i.e., p is not incident to any segment to the left or on L, consider the two 45° rays $r_1$, $r_2$ emanating from p extending to the left of L, where $r_1$, extends above $r_2$. Rays $r_1$, $r_2$ are the bisector between p and L as shown in FIG. 21a.

Let $v_1$, $v_2$ be the points where $r_1$, $r_2$ intersect the wavefront, respectively. To compute vertex $v_i$, i=1, 2, a binary search is performed in T to identify the pair of spike bisectors whose endpoints lie on opposite sides of $r_i$. The part of the wavefront between $v_1$ and $v_2$ is part of the final Voronoi diagram and $v_1$ and $v_2$ are final Voronoi vertices.

(b) If S(p) contains only one vertical segment $s_1$ (k=1), let $r_1$ and $r_2$ be the 45° rays extending to the left of L emanating from the endpoints of $s_1$. Continue as in step 1. (a).

Figure 21B:
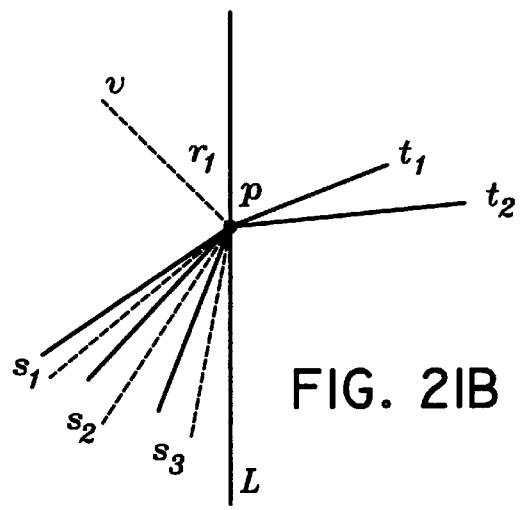
Figure 21C:
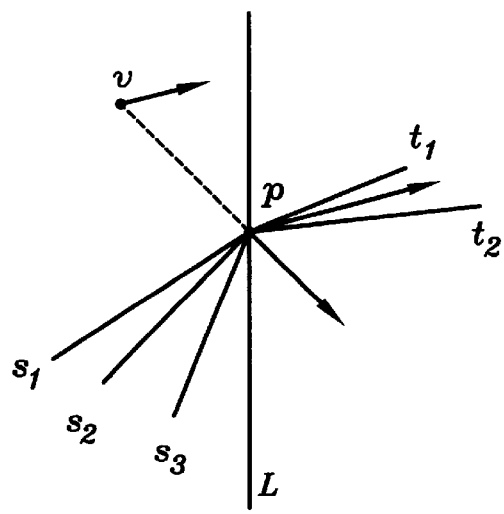

(c) If S(p) includes more than one segment (k≧2) then all individual wavefronts between $s_1$ and $s_k$ vanish at p as shown in FIG. 21b. All spike bisectors between $s_1$ and $s_k$ are incident at p and become part of the final Voronoi diagram. The final value for their endpoint is p.

(d) If the slope of $s_1$ is positive (i.e., the upper-left quadrant of p contains no segments in S(p)) let $r_1$ be the segment of the wavefront incident to p extending above $s_1$ as shown in FIG. 21b. (The slope of $r_1$ is −1). The wavefront segment $r_1$ becomes part of the final Voronoi diagram. Let $v_1$ be the other endpoint of $r_1$. Clearly $v_1$ becomes a Voronoi vertex and the incident spike bisector becomes a Voronoi edge.

(e) If the slope of $s_k$ is negative (i.e., the lower-left quadrant of p contains no segments in S(p)) let $r_2$ be the segment of the wavefront incident to p extending below $s_k$ (The slope of $r_2$ is +1). The wavefront segment $r_2$ becomes part of the final Voronoi diagram. Vertex $v_2$ at the other endpoint of $r_2$ becomes a Voronoi vertex and the incident spike bisector becomes a Voronoi edge.

2. Update the Voronoi diagram thus far by inserting the portion of the wavefront identified in step 1.

3. Delete from the sweep line status T all spike bisectors that became part of the final diagram as well as all segments in S(p).

4. Generate new spike bisectors. (In FIG. 22c, spike bisectors are illustrated in arrows).

(a) Generate a new spike bisector for every pair of consecutive segments in T(p) (if any). The endpoint of each spike bisector is parameterized so that its horizontal distance from L equals its $L_\infty$ distance from any of the two segments inducing it.

(b) If T(p) is empty generate two new 45° spike bisectors emanating from p extending to the right of L. If T(p) contains only a vertical edge t, then the two 45° spike bisectors emanate from the endpoints of $t_1$.

(c) Generate a new spike bisector for every Voronoi vertex $v_i$, i=1, 2, produced in steps 1.(a),1.(b),1.(d),1.(e) (if any). Let $e_i$ denote the element of G inducing the wavefront segment incident to $v_i$. Let $b_i$, i=1, 2 denote the new spike bisector with a start point at $v_i$.

If segment $t_1$, (respectively, $t_i$) has positive (respectively, negative) slope, let $b_1$ (respectively, $b_2$) be the bisector of $e_1$ (respectively, $e_2$) and $t_1$, (respectively, $t_2$). Otherwise, let $b_i$, i=1, 2 be the bisector of $e_i$ and the horizontal line through p.

(d) If $s_1$ (if any) has negative slope and $t_1$ (if any) has positive slope, generate a new spike bisector b with start point at p extending above p defined by the lines through $s_1$ and $t_1$. (Note that b may extend to the right or to the left of L). The endpoint of b is parameterized so that its horizontal distance from L equals its $L_\infty$ distance from $s_1$ (respectively, $s_k$).

Similarly in the case where $s_k$ has positive slope and tm has negative slope. In this case b is the bisector extending below p defined by the lines through $s_k$ and tm.

5. Update the sweep line status T by inserting all new spike bisectors of step 4. and all nonvertical segments in T(p). The insertion order is the natural order of the wavefront.

6. For every new spike bisector b generated in step 4. create at most one new spike event by considering the first intersection along b (if any) with its upper and lower neighbor in T. Insert those spike events in the event-list after correctly recording their priority values.

Spike events are handled similarly. Let q be a spike event induced by two (or more) spike bisectors $b_1, \ldots, b_k$, k≧2. If q is valid $b_1, \ldots, b_k$ must be neighboring in T. Otherwise q is invalid. Invalid spike events are simply discarded. A valid spike event q is a Voronoi vertex of the final diagram. Bisectors $b_1, \ldots, b_k$ become part of the final diagram and get deleted from T. A new spike bisector b emanating from q is generated and inserted in T. b is induced by the topmost element inducing $b_1$ and the bottommost element inducing $b_k$. At most one new spike event is generated from the first intersection of b with its upper and lower neighbor in T. (Only the first intersection along b induces a spike event).

Figure 22:
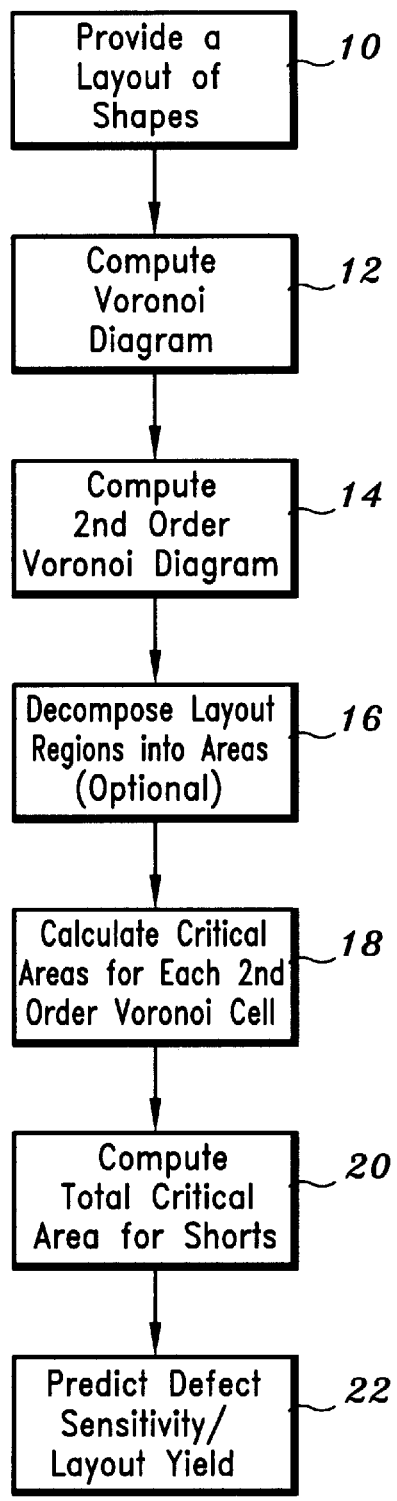
FIG. 22 is a block/flow diagram for a method and system for determining critical area for circuit layouts in accordance with the present invention.

It should be understood that the elements shown in FIG. 22 may be implemented in various forms of hardware, software or combinations thereof. Preferably, these elements are implemented in software on one or more appropriately programmed general purpose digital computers having a processor and memory and input/output interfaces. Referring to FIG. 22, a block/flow diagram illustrates a system and method for calculating critical area for shorts in accordance with the present invention. In block 10, a layout of shapes is supplied to the system. These shapes may include components, nets, circuits, etc. in a plane. In block 12, Voronoi diagram are computed and generated as described above. In block 14, second order Voronoi diagrams are computed and generated as described above. Voronoi cells of the Voronoi diagrams generated may be decomposed into areas including triangles, rectangles and/or trapezoids in block 16. This step is optional as a more efficient approach may be used by classifying Voronoi edges as will be set forth below.

A Voronoi edge has two owners , as defined above. There are prime Voronoi edges and non-prime Voronoi edges. A prime Voronoi edge is parallel to its owners while a non-prime Voronoi edge include edges other than prime edges. Every edge in the 2nd order Voronoi diagram of a layout is colored red or blue or neutral with respect to each one of its owners. If a Voronoi edge is colored red with respect to one owner then it should be colored red or neutral with respect to the other owner. In other words, a Voronoi edge colored red with respect to one owner cannot be colored blue with respect to the other. In the rectilinear case, there are only red and blue edges (no neutral).

A prime Voronoi edge is colored red with respect to its owner e, if e and the interior of the corresponding Voronoi cell lie at opposite sides of the edge. Otherwise, a prime Voronoi cell is colored blue with respect to e. That is, a prime Voronoi cell is colored blue with respect to owner e if interior of the corresponding Voronoi cell and the owner lie at the same side of e. Referring to FIG. 23, red Voronoi edges are shown as thick lines and blue Voronoi edges are shown as thin lines. Note that the prime Voronoi edges are incident to rectangles in the decomposition. Note also that prime Voronoi edges are never colored neutral.

Non-prime Voronoi edges are colored red, blue or -neutral with respect to an owner e as follows: A Voronoi edge perpendicular to the owner is colored neutral with respect to that owner. (Note only 45° Voronoi edges incident to a rectangle can be colored neutral). A Voronoi edge corresponding to the hypotenuse of a diverging triangle is colored red. A Voronoi edge corresponding to the hypotenuse of a converging triangle is colored blue. This is described in greater detail hereinabove.

A Voronoi edge that has been colored neutral with respect to an owner e does not contribute to critical area with respect to that Voronoi cell. In FIG. 23, neutral edges are shown in dashed lines.

Given the 2nd order Voronoi diagram of the shapes in one layer of the layout, the critical area is computed by adding up critical area within each Voronoi cell in block 18 of FIG. 22. In each Voronoi cell, the critical area is derived as a function of the Voronoi edges bounding that cell. Let e denote the owner of the cell. For each red prime Voronoi edge $e_i$, add $$\frac{r_0^2}{2}\frac{S_i l_i}{r_i}$$

to the total critical area. For each blue prime Voronoi edge (or boundary) $e_m$, subtract $$\frac{r_0^2}{2}\frac{S_m l_m}{r_m}$$

from the total critical area. For each non-prime Voronoi edge which is colored red with respect to the owner e, add $$\frac{r_0^2}{2}S_e^2 T_e \ln\frac{r_k}{r_j}.$$

For each non-prime Voronoi (or boundary) edge $e_j$ which is colored with respect to the owner e, subtract $$\frac{r_0^2}{2}S_e^2 T_e \ln\frac{r_k}{r_j}.$$

The factors $S_e$, $T_e$, $S_i$, $l_i$, and r's are as defined above. Also, neutral edges do not add or subtract to the critical area. A total critical area is determined by summing the critical areas of the layout in block 20 as described. Other formulas are contemplated for area computations in accordance with the invention as well.

It is to be understood that the steps in blocks 12, 14, 18 and 20 may be computed simultaneously during a plane sweep. In other words, there is no need to first compute the whole Voronoi diagram, then compute the 2nd order Voronoi diagram and then compute the critical area. Instead, as the plane sweep proceeds, as soon as a Voronoi cell is computed, the 2nd order Voronoi edges within that cell may be computed, and the critical area derived for that portion of the cell contributing to the total critical area.

Defect sensitivity and layout yield are predicted in block 22. Design changes for the layout may be based on these predictions.

It has been shown how to compute and use the second order Voronoi diagram of polygons to efficiently compute critical area for shorts in a single layer for planar circuits or a level of a circuit for an integrated circuit. The value of critical area can then be used in evaluating yield. Furthermore, the Voronoi diagram is used to identify the places in the layout that are most vulnerable to spot defects. Note that Voronoi edges provide immediate information about the partial critical area caused by the corresponding pair of layout edges. In other words, information about those layout edges that contribute most to critical area may be readily obtained. By slightly perturbing such edges the present invention is able to reduce the value of critical area and thus increase yield. Note that after moving an edge the Voronoi diagram can be updated dynamically in time proportional to the changes caused to the diagram because of the move. Thus, the Voronoi diagram approach is suitable for an interactive critical area tool. Note also that a topographic map essentially provides a bitmapped version of the more critical Voronoi edges. The Voronoi diagram approach can also be extended to layouts with shapes in arbitrary orientations as described.

Having described preferred embodiments of a method and system for determining critical area for circuit layouts (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for computing critical area for shorts of a layout, comprising the steps of:
    computing a Voronoi diagram for the layout;
    computing a second order Voronoi diagram to arrive at a partitioning of the layout into regions;
    computing critical area within each region; and
    summing the critical areas to arrive at a total critical area for shorts in the layout.

2. The method as recited in claim 1, further comprising the step of decomposing each region into shapes for calculating the critical areas.

3. The method as recited in claim 2, wherein the shapes are associated with second order Voronoi edges.

4. The method as recited in claim 1, wherein the step of computing critical area includes the step of computing the critical area according to the following equation:

$$A_c = \int_0^\infty A(r)D(r)dr,$$

where $A_c$ is the critical area, A(r) is the area of the critical region for defects of radius r and D(r) is a defect density function.

5. The method as recited in claim 4, wherein the defect density function includes the defect size distribution D(r)= $r_0^2/r^3$ where r denotes spot defect radius and $r_0$ denotes a constant size.

6. The method as recited in claim 1, wherein the second order Voronoi diagram includes Voronoi edges associated with shapes of the layout and the method further comprises the steps of classifying the Voronoi edges to identify between areas of the regions that contribute to the critical area and areas of the regions that subtract from the critical area.

7. The method as recited in claim 6, wherein the shapes include locations for circuit components.

8. The method as recited in claim 1, wherein the Voronoi diagram and the second order Voronoi diagram include an $L_\infty$ distance metric.

9. The method as recited in claim 1, wherein the step of computing the Voronoi diagram includes the step of computing the Voronoi diagram using a sweep line algorithm.

10. The method as recited in claim 1, wherein the step of computing the second order Voronoi diagram includes the step of computing the Voronoi diagram using a sweep line algorithm.

11. The method as recited in claim 1, further comprising the step of computing critical areas for regions of the layout associated with shapes having edges with a slope of ±1.

12. The method as recited in claim 1, further comprising the step of computing critical areas for regions of the layout associated with shapes having edges running horizontally and vertically.

13. The method as recited in claim 1, further comprising the step of adapting computations of critical areas for the regions of the layout associated with shapes in the layout having edges with any slope.

14. The method as recited in claim 1, wherein the step of summing the critical areas includes the steps of:
adding critical areas that contribute to the total critical areas;
subtracting critical areas that reduce the total critical area; and
ignoring other critical areas.

15. A method for predicting yield based on critical area for shorts of a layout of a circuit, comprising the steps of:
computing a Voronoi diagram for the layout;
computing a second order Voronoi diagram to arrive at a partitioning of the layout into regions;
computing critical area within each region;
summing the critical areas to arrive at a total critical area for shorts in the layout;
predicting a sensitivity to defects of the layout based on the total critical area; and
modifying the layout according to the sensitivity.

16. The method as recited in claim 15, further comprising the step of decomposing each region into shapes for calculating the critical areas.

17. The method as recited in claim 15, wherein the step of computing critical area includes the step of computing the critical area according to the following equation:

$$A_c = \int_0^\infty A(r)D(r)dr,$$

where $A_c$ is the critical area, $A(r)$ is the area of the critical region for defects of radius r and $D(r)$ is a defect density function.

18. The method as recited in claim 17, wherein the defect density function includes the defect size distribution $D(r) = r_0^2/r^3$ where r denotes spot defect radius and $r_0$ denotes a constant size.

19. The method as recited in claim 15, wherein the second order Voronoi diagram includes Voronoi edges associated with shapes of the layout and the method further comprises the steps of classifying the Voronoi edges to identify between areas of the layout that contribute to the critical area and areas that subtract from the critical area.

20. The method as recited in claim 15, wherein the shapes include locations for circuit components.

21. The method as recited in claim 15, wherein the Voronoi diagram and the second order Voronoi diagram include an $L_\infty$ distance metric.

22. The method as recited in claim 15, wherein the step of computing the Voronoi diagram includes the step of computing the Voronoi diagram using a sweep line algorithm.

23. The method as recited in claim 15, wherein the step of computing the second order Voronoi diagram includes the step of computing the Voronoi diagram using a sweep line algorithm.

24. The method as recited in claim 15, further comprising the step of computing critical areas for regions of the layout associated with shapes having edges with a slope of ±1.

25. The method as recited in claim 15, further comprising the step of computing critical areas for regions of the layout associated with shapes having edges running horizontally and vertically.

26. The method as recited in claim 15, further comprising the step of adapting computations of critical areas for the regions of the layout associated with shapes in the layout having edges with any slope.

27. The method as recited in claim 15, wherein the step of summing the critical areas includes the steps of:
adding critical areas that contribute to the total critical areas;
subtracting critical areas that reduce the total critical area; and
ignoring other critical areas.

28. A computer based system for computing critical area for shorts of a layout, comprising:
means for computing a Voronoi diagram for the layout and a second order Voronoi diagram using a sweep line algorithm to arrive at a partitioning of the layout into regions;
means for computing critical area within each region; and
means for summing the critical areas to arrive at a total critical area for shorts in the layout.

29. The system as recited in claim 28, further comprises means for decomposing each region into shapes for calculating the critical areas.

30. The system as recited in claim 29, wherein the shapes include at least one of triangles, rectangles and trapezoids.

31. The system as recited in claim 28, wherein the means for computing critical area includes means for computing the critical area according to the following equation:

$$A_c = \int_0^\infty A(r)D(r)dr,$$

where $A_c$ is the critical area, $A(r)$ is the area of the critical region for defects of radius r and $D(r)$ is a defect density function.

32. The system as recited in claim 31, wherein the defect density function includes the defect size distribution $D(r) = r_0^2/r^3$ where r denotes spot defect radius and $r_0$ denotes a constant size.

33. The system as recited in claim 28, wherein the Voronoi diagram and the second order Voronoi diagram include an $L_\infty$ distance metric.

34. The system as recited in claim 28, further comprises means for adapting computations of critical areas for the regions of the layout associated with shapes in the layout having edges with any slope.

35. The system as recited in claim 28, wherein the layout includes nets.

36. The system as recited in claim 28, wherein the layout includes circuit components.

* * * * *